US012575271B2

(12) United States Patent
Du et al.

(10) Patent No.: US 12,575,271 B2
(45) Date of Patent: Mar. 10, 2026

(54) DISPLAY PANEL AND DISPLAY DEVICE

(71) Applicants:Chengdu BOE Optoelectronics Technology Co., Ltd., Chengdu (CN); BOE TECHNOLOGY GROUP CO., LTD., Beijing (CN)

(72) Inventors: Lili Du, Beijing (CN); Yao Huang, Beijing (CN); Kaipeng Sun, Beijing (CN); Benlian Wang, Beijing (CN); Jianchang Cai, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 771 days.

(21) Appl. No.: 17/781,789

(22) PCT Filed: Jul. 19, 2021

(86) PCT No.: PCT/CN2021/107086
§ 371 (c)(1),
(2) Date: Jun. 2, 2022

(87) PCT Pub. No.: WO2023/000134
PCT Pub. Date: Jan. 26, 2023

(65) Prior Publication Data
US 2024/0107829 A1     Mar. 28, 2024

(51) Int. Cl.
*H10K 59/131*          (2023.01)
(52) U.S. Cl.
CPC .................................. *H10K 59/131* (2023.02)

(58) Field of Classification Search
CPC .................................................. H10K 59/131
See application file for complete search history.

(56) References Cited

U.S. PATENT DOCUMENTS

2020/0394959 A1    12/2020  Lou et al.
2021/0193782 A1*    6/2021  Seo ...................... H10K 59/131

FOREIGN PATENT DOCUMENTS

CN        110767695 A     2/2020
CN        111725287 A     9/2020
(Continued)

OTHER PUBLICATIONS

International Search Report in PCT/CN2021/107086 dated Apr. 21, 2022 in Chinese.
(Continued)

*Primary Examiner* — Nathan W Ha
(74) *Attorney, Agent, or Firm* — Collard & Roe, P.C.

(57)          ABSTRACT

A display panel and a display device are provided. The display panel includes: a base substrate, having a first display region and a second display region, the first display region is located at at least one side of the second display region; a plurality of first pixel circuits, located in the first display region; a plurality of first light-emitting elements, located in the first display region to each drive at least one first light-emitting element; a plurality of second pixel circuits, located in the first display region; a plurality of second light-emitting elements, located in the second display region to each drive at least one second light-emitting element; and a plurality of conductive lines, the second pixel circuit is connected to the second light-emitting element through at least one conductive line.

20 Claims, 21 Drawing Sheets

(56)　　　　　　　References Cited

FOREIGN PATENT DOCUMENTS

| CN | 111769148 | A | * | 10/2020 | ......... | H01L 27/3227 |
| CN | 112435586 | A | | 3/2021 | | |

OTHER PUBLICATIONS

Written Opinion in PCT/CN2021/107086 dated Apr. 21, 2022 in Chinese.
Written Opinion of the International Search Authority in PCT/CN2021/107086 dated Apr. 21, 2022 in English.
International Search Report in PCT/CN2021/107086 dated Apr. 21, 2022 in English.

* cited by examiner

100

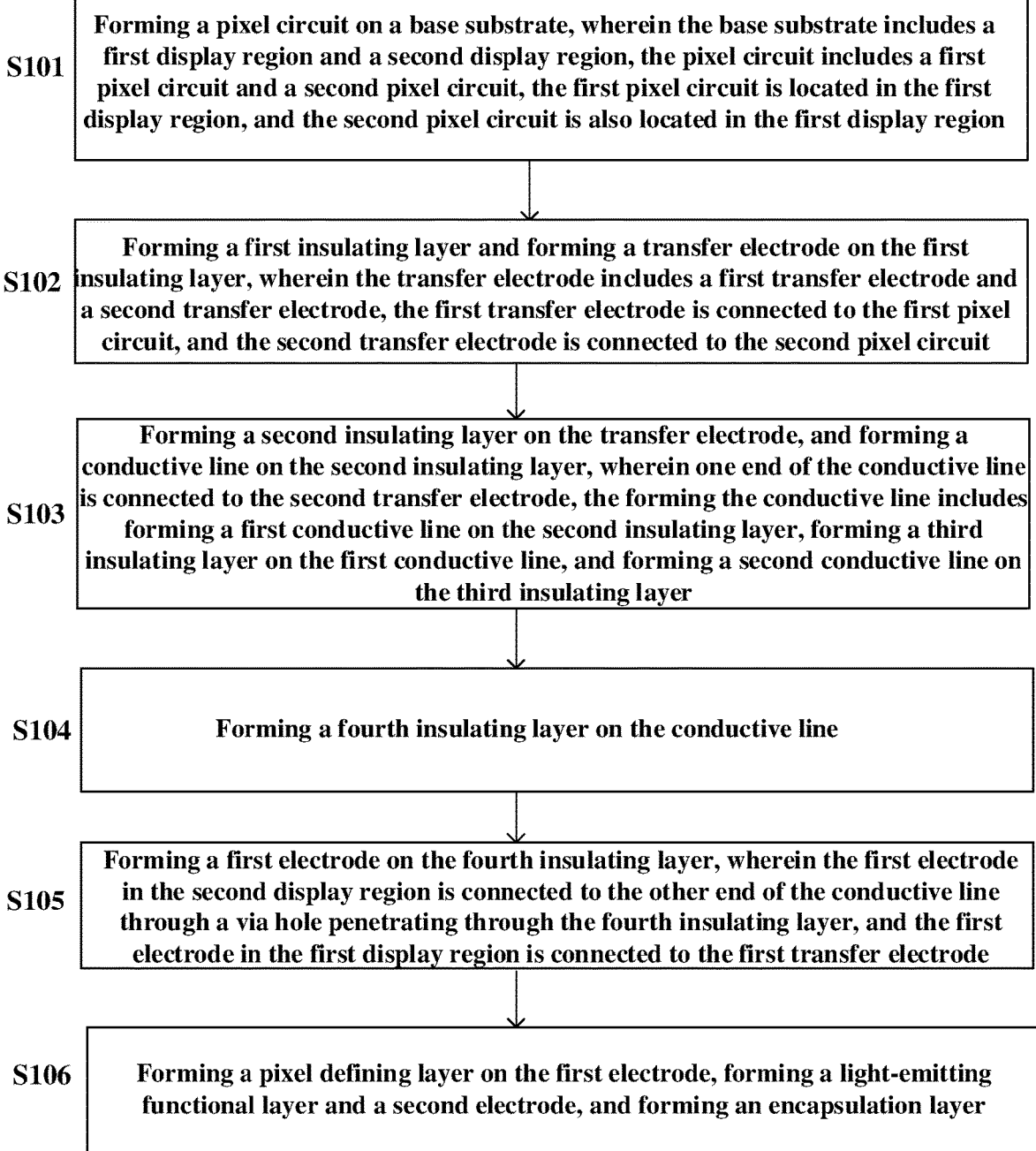

S101 — Forming a pixel circuit on a base substrate, wherein the base substrate includes a first display region and a second display region, the pixel circuit includes a first pixel circuit and a second pixel circuit, the first pixel circuit is located in the first display region, and the second pixel circuit is also located in the first display region S102 — Forming a first insulating layer and forming a transfer electrode on the first insulating layer, wherein the transfer electrode includes a first transfer electrode and a second transfer electrode, the first transfer electrode is connected to the first pixel circuit, and the second transfer electrode is connected to the second pixel circuit S103 — Forming a second insulating layer on the transfer electrode, and forming a conductive line on the second insulating layer, wherein one end of the conductive line is connected to the second transfer electrode, the forming the conductive line includes forming a first conductive line on the second insulating layer, forming a third insulating layer on the first conductive line, and forming a second conductive line on the third insulating layer S104 — Forming a fourth insulating layer on the conductive line S105 — Forming a first electrode on the fourth insulating layer, wherein the first electrode in the second display region is connected to the other end of the conductive line through a via hole penetrating through the fourth insulating layer, and the first electrode in the first display region is connected to the first transfer electrode S106 — Forming a pixel defining layer on the first electrode, forming a light-emitting functional layer and a second electrode, and forming an encapsulation layer

FIG. 24

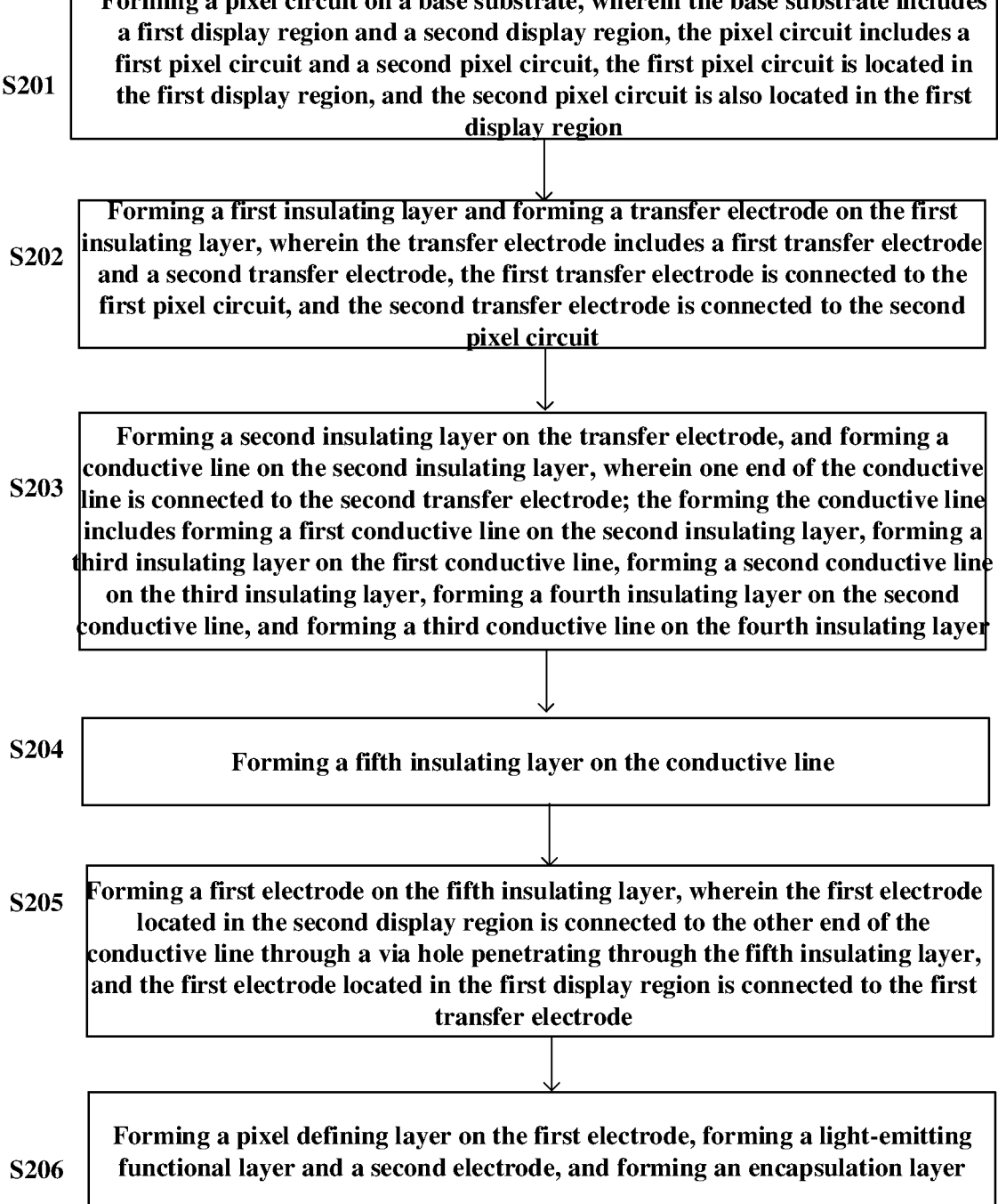

S201  Forming a pixel circuit on a base substrate, wherein the base substrate includes a first display region and a second display region, the pixel circuit includes a first pixel circuit and a second pixel circuit, the first pixel circuit is located in the first display region, and the second pixel circuit is also located in the first display region S202  Forming a first insulating layer and forming a transfer electrode on the first insulating layer, wherein the transfer electrode includes a first transfer electrode and a second transfer electrode, the first transfer electrode is connected to the first pixel circuit, and the second transfer electrode is connected to the second pixel circuit S203  Forming a second insulating layer on the transfer electrode, and forming a conductive line on the second insulating layer, wherein one end of the conductive line is connected to the second transfer electrode; the forming the conductive line includes forming a first conductive line on the second insulating layer, forming a third insulating layer on the first conductive line, forming a second conductive line on the third insulating layer, forming a fourth insulating layer on the second conductive line, and forming a third conductive line on the fourth insulating layer S204  Forming a fifth insulating layer on the conductive line S205  Forming a first electrode on the fifth insulating layer, wherein the first electrode located in the second display region is connected to the other end of the conductive line through a via hole penetrating through the fifth insulating layer, and the first electrode located in the first display region is connected to the first transfer electrode S206  Forming a pixel defining layer on the first electrode, forming a light-emitting functional layer and a second electrode, and forming an encapsulation layer

FIG. 25

DISPLAY PANEL AND DISPLAY DEVICE

CROSS REFERENCE TO RELATED APPLICATIONS

This application is the National Stage of PCT/CN2021/107086 filed on Jul. 19, 2021, the disclosure of which is incorporated by reference.

TECHNICAL FIELD

At least one embodiment of the present disclosure relates to a display panel and a display device.

BACKGROUND

With the consumers' continuous pursuit of the viewing angle effect of display products, extremely narrow frame or even full-screen display has become a new trend of organic light-emitting diode (OLED) products. With the screen-to-body ratio of many high-end mobile phones rising gradually and steadily, full screen has become the current trend. The key problem of full screen is how to deal with the front camera. In order to achieve a higher screen-to-body ratio, notch screen, droplet screen, drilled screen, and so on have appeared one after another. Although these forms of full screen have increased the screen-to-boy ratio, the appearance value of the mobile phone has considerably dropped. As a result, with comprehensive consideration, the under-screen camera is the best choice for full screen.

The under-screen camera means that the front camera is located under the screen but does not affect the display function of the screen. When the front camera is not in use, the screen above the camera can still display images normally. Therefore, from the appearance point of view, the under-screen camera will not involve any camera holes, which truly achieves the full-screen display effect.

SUMMARY

At least one embodiment of the present disclosure relates to a display panel and a display device.

At least one embodiment of the present disclosure provides a display panel, including: a base substrate, having a first display region and a second display region, wherein the first display region is located at at least one side of the second display region; a plurality of first pixel circuits, located in the first display region; a plurality of first light-emitting elements, located in the first display region, wherein each of the plurality of first pixel circuits is configured to drive at least one first light-emitting element of the plurality of first light-emitting elements; a plurality of second pixel circuits, located in the first display region; a plurality of second light-emitting elements, located in the second display region, wherein each of the plurality of second pixel circuits is configured to drive at least one second light-emitting element of the plurality of second light-emitting elements; and a plurality of conductive lines, wherein the second pixel circuit is connected to the second light-emitting element through at least one conductive line, wherein the plurality of second light-emitting elements include a plurality of groups, at least one group of the plurality of groups includes a plurality of subgroups, each of the plurality of subgroups includes at least one second light-emitting element, and in a same group, conductive lines connected to second light-emitting elements of different subgroups are located between second light-emitting elements of different adjacent groups.

For example, the plurality of groups are arranged in a first direction, and the plurality of subgroups are arranged in a second direction.

For example, the first direction includes a row direction, and the second direction includes a column direction.

For example, conductive lines connected to second light-emitting elements in a same subgroup are located in a same layer.

For example, in a same group, conductive lines connected to second light-emitting elements in different subgroups are located in a same layer.

For example, the plurality of conductive lines include at least two overlapped conductive lines, and overlapping portions of two conductive lines of the at least two overlapped conductive lines extend along the first direction.

For example, at least two insulating layers are disposed between the at least two overlapped conductive lines.

For example, in a same group, conductive lines connected to second light-emitting elements of a same subgroup are located between second light-emitting elements of same adjacent groups.

For example, the plurality of subgroups include a first subgroup and a second subgroup, and a conductive line connected to a second light-emitting element in the first subgroup and a conductive line connected to a second light-emitting element in the second subgroup are separated by at least one group of second light-emitting elements.

For example, the plurality of subgroups further include a third subgroup, the first subgroup, the second subgroup and the third subgroup are arranged in sequence, and the conductive line connected to the second light-emitting element in the second subgroup and a conductive line connected to a second light-emitting element in the third subgroup are separated by at least one group of second light-emitting elements.

For example, the plurality of second pixel circuits are distributed, at intervals, among the plurality of first pixel circuits.

For example, at least one first pixel circuit of the plurality of first pixel circuits is connected to at least one first light-emitting element of the plurality of first light-emitting elements, and an orthographic projection of the at least one first pixel circuit on the base substrate at least partially overlaps with an orthographic projection of the at least one first light-emitting element on the base substrate.

For example, at least one second pixel circuit of the plurality of second pixel circuits is connected to at least one second light-emitting element of the plurality of second light-emitting elements through at least one conductive line.

For example, orthographic projections of the plurality of second pixel circuits on the base substrate have no overlap with orthographic projections of the plurality of second light-emitting elements on the base substrate.

For example, the first display region surrounds the second display region, and a shape of the second display region includes a circle shape.

For example, the second display region is axisymmetric.

For example, the second display region includes a first symmetry axis extending in a first direction and a second symmetry axis extending in a second direction.

For example, the plurality of conductive lines include a plurality of first conductive lines located in a first pattern layer, a plurality of second conductive lines located in a second pattern layer and a plurality of third conductive lines located in a third pattern layer; the first pattern layer, the second pattern layer and the third pattern layer are arranged in sequence; and an orthographic projection of one first conductive line located in the first pattern layer on the base substrate partially overlaps with an orthographic projection of one third conductive line located in the third pattern layer on the base substrate.

For example, the plurality of conductive lines include portions passing through a virtual dividing line between the first display region and the second display region, and portions, passing through the virtual dividing line between the first display region and the second display region, of conductive lines connected to second light-emitting elements of different subgroups, are located between second light-emitting elements of different adjacent groups.

At least one embodiment of the present disclosure also provides a display device, including the display panel described in any of the above.

For example, the display device further includes a photosensitive sensor, the photosensitive sensor is located at one side of the display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

FIG. 24 is a schematic diagram of a manufacturing method of a display panel provided by an embodiment of the present disclosure;

FIG. 25 is a schematic diagram of a manufacturing method of a display panel provided by an embodiment of the present disclosure.

DETAILED DESCRIPTION

In order to make objectives, technical details, and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
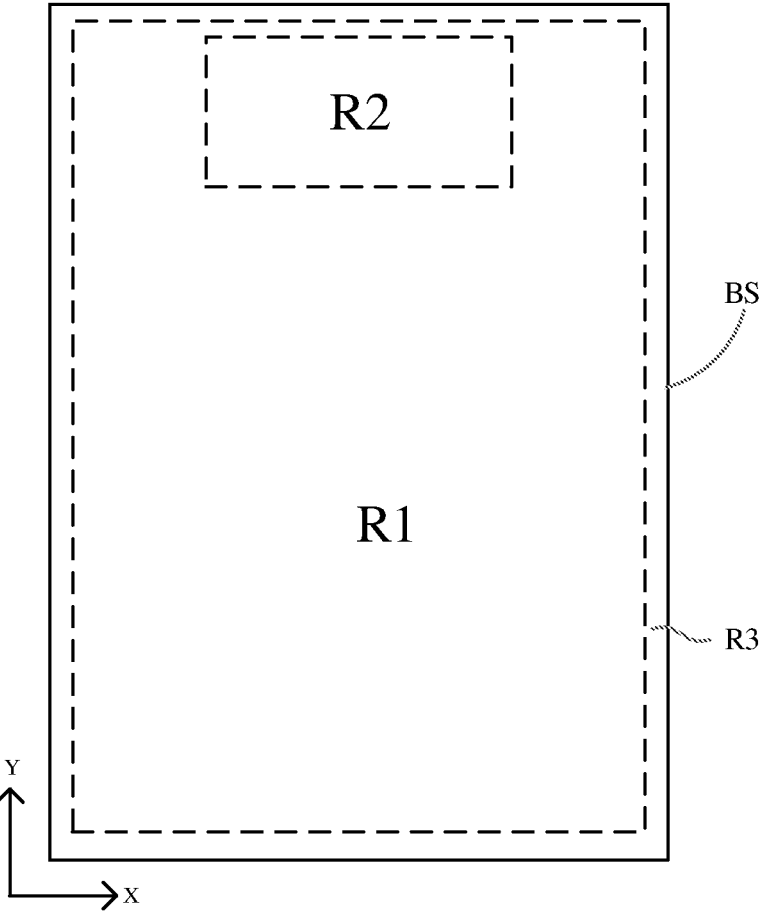
FIG. 1 is a schematic diagram of a display panel provided by an embodiment of the present disclosure.

FIG. 1 is a schematic diagram of a display panel provided by an embodiment of the present disclosure. As shown in FIG. 1, the display panel can include a base substrate BS.

The display panel includes a first display region R1 and a second display region R2, and the first display region R1 can be located at at least one side of the second display region R2. For example, in some embodiments, the first display region R1 surrounds the second display region R2. That is, the second display region R2 can be surrounded by the first display region R1. The second display region R2 can also be arranged at other positions, and the arrangement position of the second display region R2 can be determined according to needs. For example, the second display region R2 can be located at the top middle position of the base substrate BS, or can be located at the upper left position or the upper right position of the base substrate BS. For example, a hardware such as a photosensitive sensor (e.g., a camera) is disposed in the second display region R2 of the display panel. For example, the second display region R2 is a light-transmitting display region, and the first display region R1 is a display region. For example, the first display region R1 is opaque and only used for display. FIG. 1 further shows a peripheral region R3. For example, the peripheral region R3 is a non-display region.

In a common display panel, the density of light-emitting elements in the second display region R2 is smaller than the density of light-emitting elements in the first display region R1, and the display brightness of the second display region R2 is much lower than the display brightness of the first display region R1. For example, the brightness of the first display region R1 is twice the brightness of the second display region R2, resulting in uneven display brightness.

Figure 2:
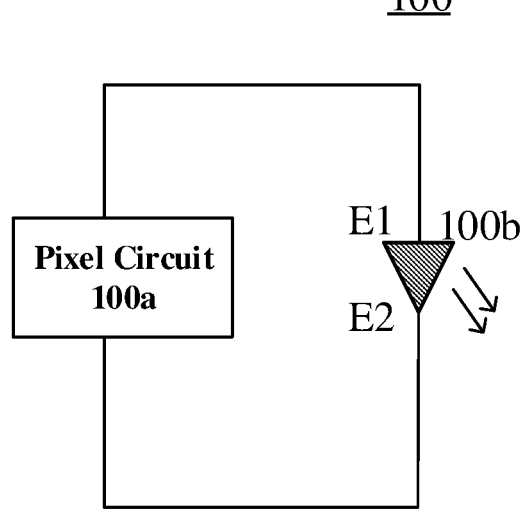
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100, and the pixel unit 100 is located on a base substrate. As shown in FIG. 2, the pixel unit 100 includes a pixel circuit 100*a* and a light-emitting element 100*b*, and the pixel circuit 100*a* is configured to drive the light-emitting element 100*b*. For example, the pixel circuit 100*a* is configured to provide a driving current to drive the light-emitting element 100*b* to emit light. For example, the light-emitting element 100*b* is an organic light-emitting diode (OLED), and the light-emitting element 100*b* emits red light, green light, blue light or white light, etc., under the drive of the corresponding pixel circuit 100*a*. The color of the light emitted by the light-emitting element 100*b* can be determined according to needs. As shown in FIG. 2, the light-emitting element 100*b* includes a first electrode E1, a second electrode E2, and a light-emitting functional layer located between the first electrode E1 and the second electrode E2. For example, the first electrode E1 is an anode and the second electrode E2 is a cathode, but it is not limited to this case. For example, the first electrode E1 can be a pixel electrode and the second electrode E2 can be a common electrode.

In order to increase the light transmittance of the second display region R2, only light-emitting elements may be disposed in the second display region R2, and the pixel circuits for driving the light-emitting elements in the second display region R2 can be disposed outside the second display region R2. For example, the pixel circuits for driving the light-emitting elements in the second display region R2 can be disposed in the first display region R1 or in the peripheral region R3. That is, the light transmittance of the second display region R2 is increased by separately arranging the light-emitting elements and the pixel circuits.

Figure 3:
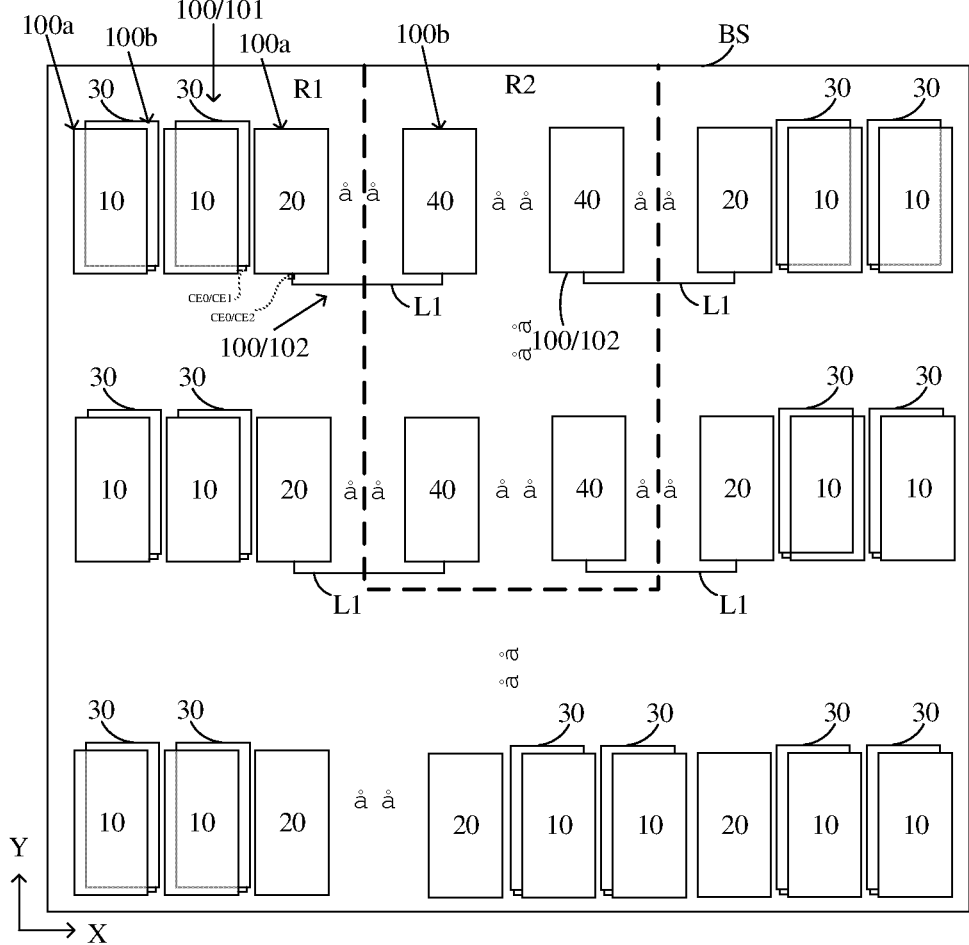
FIG. 3 is a schematic diagram of a display panel provided by an embodiment of the present disclosure.

FIG. 3 is a schematic diagram of a display panel provided by an embodiment of the present disclosure. As shown in FIG. 3, the display panel includes a plurality of first pixel circuits 10, a plurality of second pixel circuits 20 and a plurality of first light-emitting elements 30, which are located in the first display region R1; and a plurality of second light-emitting elements 40 located in the second display region R2. For example, the plurality of second pixel circuits 20 can be distributed, at intervals, among the plurality of first pixel circuits 10.

For example, as shown in FIG. 3, at least one first pixel circuit 10 of the plurality of first pixel circuits 10 can be connected to at least one first light-emitting element 30 of the plurality of first light-emitting elements 30, and the orthographic projection of the at least one first pixel circuit 10 on the base substrate BS at least partially overlaps with the orthographic projection of the at least one first light-emitting element 30 on the base substrate BS. The at least one first pixel circuit 10 can be configured to provide a driving signal for the first light-emitting element 30 connected thereto, so as to drive the first light-emitting element 30 to emit light.

For example, as shown in FIG. 3, at least one second pixel circuit 20 of the plurality of second pixel circuits 20 can be connected to at least one second light-emitting element 40 of the plurality of second light-emitting elements 40 through a conductive line L1, and the at least one second pixel circuit 20 can be configured to provide a driving signal for the second light-emitting element 40 connected thereto, so as to drive the second light-emitting element 40 to emit light. As shown in FIG. 3, because the second light-emitting element 40 and the second pixel circuit 20 are located in different regions, there is no overlap between the orthographic projection of the at least one second pixel circuit 20 on the base substrate BS and the orthographic projection of the at least one second light-emitting element 40 on the base substrate BS.

For example, in the embodiments of the present disclosure, the first display region R1 can be set as an opaque display region, and the second display region R2 can be set as a light-transmitting display region. For example, the first display region R1 cannot transmit light, and the second display region R2 can transmit light. In this way, in terms of the display panel provided by the embodiment of the present disclosure, there is no need to perform a drilling process on the display panel, and the required hardware structure, such as the photosensitive sensor, etc., can be directly disposed at a position corresponding to the second display region R2 on one side of the display panel, which provides a solid foundation for the realization of a true full screen. Furthermore, because the second display region R2 only includes light-emitting elements and does not include pixel circuits, it is beneficial to increase the light transmittance of the second display region R2, so that the display panel has a better display effect.

As shown in FIG. 3, the pixel unit 100 includes a first pixel unit 101 and a second pixel unit 102. The pixel circuit 100*a* and the light-emitting element 100*b* of the first pixel unit 101 are both located in the first display region R1, the pixel circuit 100*a* of the second pixel unit 102 is located in the first display region R1, and the light-emitting element 100*b* of the second pixel unit 102 is located in the second display region R2. In the embodiments of the present disclosure, the pixel circuit 100*a* of the first pixel unit 101 is just the first pixel circuit 10, the light-emitting element 100*b* of the first pixel unit 101 is just the first light-emitting element 30, the pixel circuit 100*a* of the second pixel unit 102 is just the second pixel circuit 20, and the light-emitting element 100*b* of the second pixel unit 102 is just the second light-emitting element 40. For example, the first pixel circuit 10 can be referred to as an in-situ pixel circuit, and the second pixel circuit 20 can be referred to as an ex-situ pixel circuit.

For example, as shown in FIG. 3, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line.

As shown in FIG. 3, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of a conductive oxide material. For example, the conductive oxide material includes indium tin oxide (ITO), but is not limited thereto.

As shown in FIG. 3, one end of the conductive line L1 is connected to the second pixel circuit 20, and the other end of the conductive line L1 is connected to the second light-emitting element 40. As shown in FIG. 3, the conductive line L1 extends from the first display region R1 to the second display region R2. In other words, the conductive line L1 extends from the second display region R2 to the first display region R1.

In order to improve the display effect, the density of the second light-emitting elements 40 can be equal to the density of the first light-emitting elements 30. That is, the resolution of the second display region R2 is the same as the resolution of the first display region R1, the brightness of the second display region R2 is improved to solve the problem that the brightness of the second display region is too small, the picture uniformity of the second display region R2 is improved, the brightness difference between the second display region R2 and the first display region R1 is reduced, thus realizing a more uniform full-screen visual display effect. Furthermore, because the brightness difference between the second display region R2 and the first display region R1 is reduced, it is beneficial to obtain the second display region R2 with a larger size, thus achieving better full-screen display effect and user experience. For example, in some embodiments, the brightness of the second display region R2 is the same as the brightness of the first display region RE Of course, in some other embodiments, the density of the second light-emitting elements 40 can be greater or smaller than the density of the first light-emitting elements 30. That is, the resolution of the second display region R2 can be greater or smaller than the resolution of the first display region RE For example, in some embodiments, the light-emitting area of the second light-emitting element 40 is smaller than the light-emitting area of the first light-emitting element 30.

Figure 4:
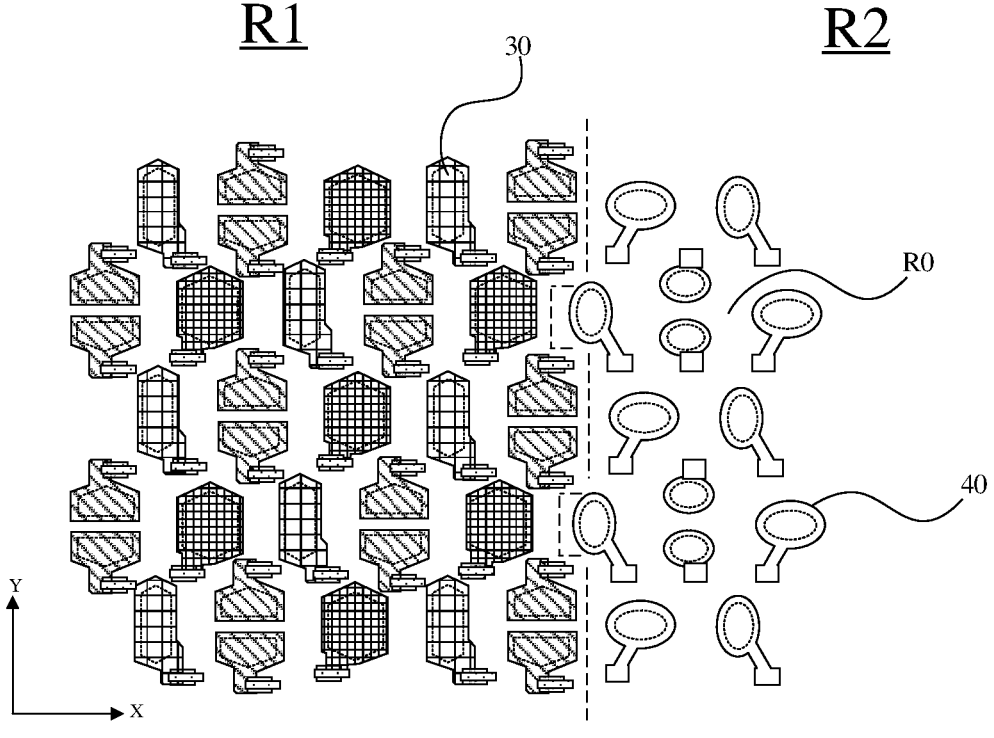
FIG. 4 is a schematic diagram of a first display region and a second display region in a display panel provided by an embodiment of the present disclosure.

FIG. 4 is a schematic diagram of a first display region and a second display region in a display panel provided by an embodiment of the present disclosure. FIG. 4 shows the light-emitting region of the second light-emitting element 40 and the light-emitting region of the first light-emitting element 30 by using dashed lines. For example, the light-emitting region of the light-emitting element can correspond to an opening of a pixel defining layer.

Figure 5:
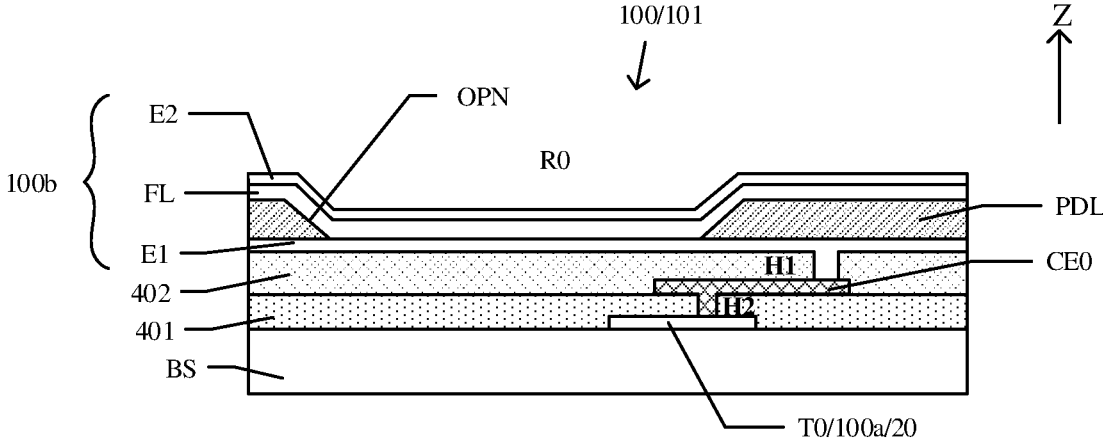
FIG. 5 is a schematic diagram of a display panel provided by an embodiment of the present disclosure.

FIG. 5 is a schematic diagram of a display panel provided by an embodiment of the present disclosure. As shown in FIG. 5, a transistor T0 is located on the base substrate BS, a transfer electrode CE0 is connected to the transistor T0 through a via hole H2 passing through an insulating layer 401, the first electrode E1 of the light-emitting element 100b is connected to the transfer electrode CE0 through a via hole H1 passing through an insulating layer 402, a pixel defining layer PDL is disposed above the first electrode E1, the pixel defining layer PDL has an opening OPN, and the opening OPN defines the light-emitting region R0 of the light-emitting element 100b. FIG. 5 further shows the light-emitting functional layer FL and the second electrode E2. For example, the first electrodes E1 of different pixel units are independent of each other and spaced apart from each other. For example, the second electrodes E2 of different pixel units can be integrally formed. As shown in FIG. 5, the transfer electrode CE0 includes a first transfer electrode CE1 and a second transfer electrode CE2. As shown in FIG. 5, the first transfer electrode CE1 is connected to the first pixel circuit 10, and the second transfer electrode CE2 is connected to the second pixel circuit 20.

Figure 6:
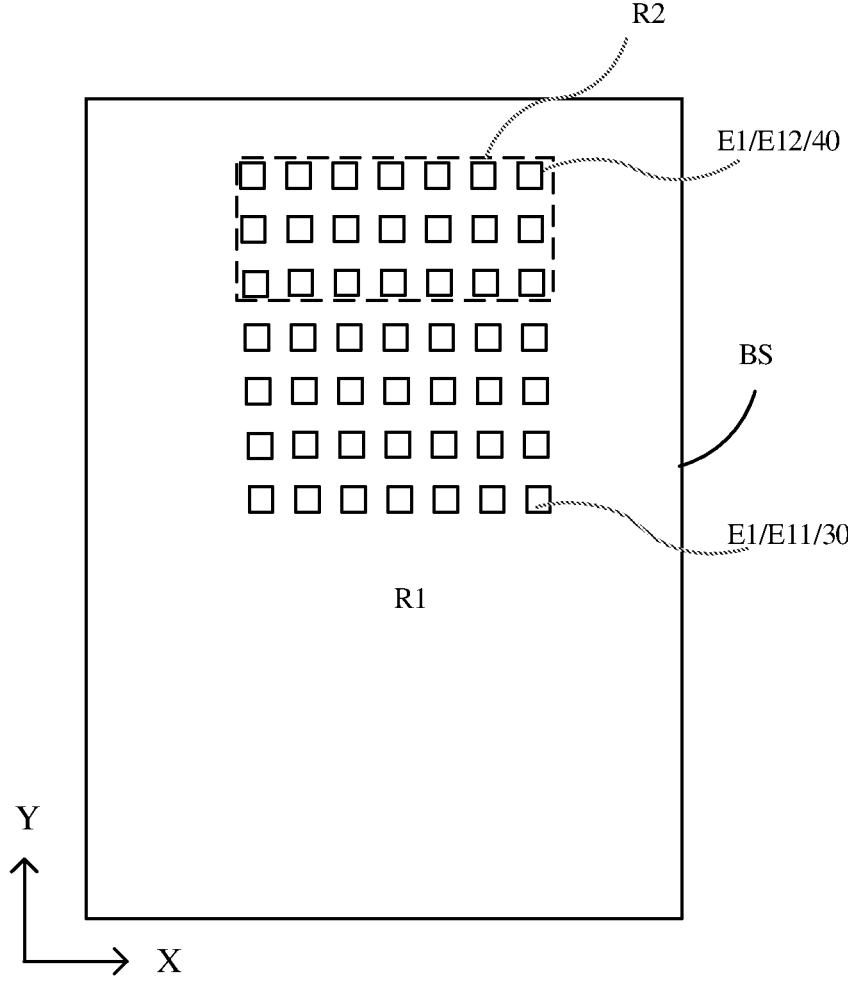
FIG. 6 is a schematic diagram of a first electrode of a light-emitting element in a display panel provided by an embodiment of the present disclosure.
Figure 7:
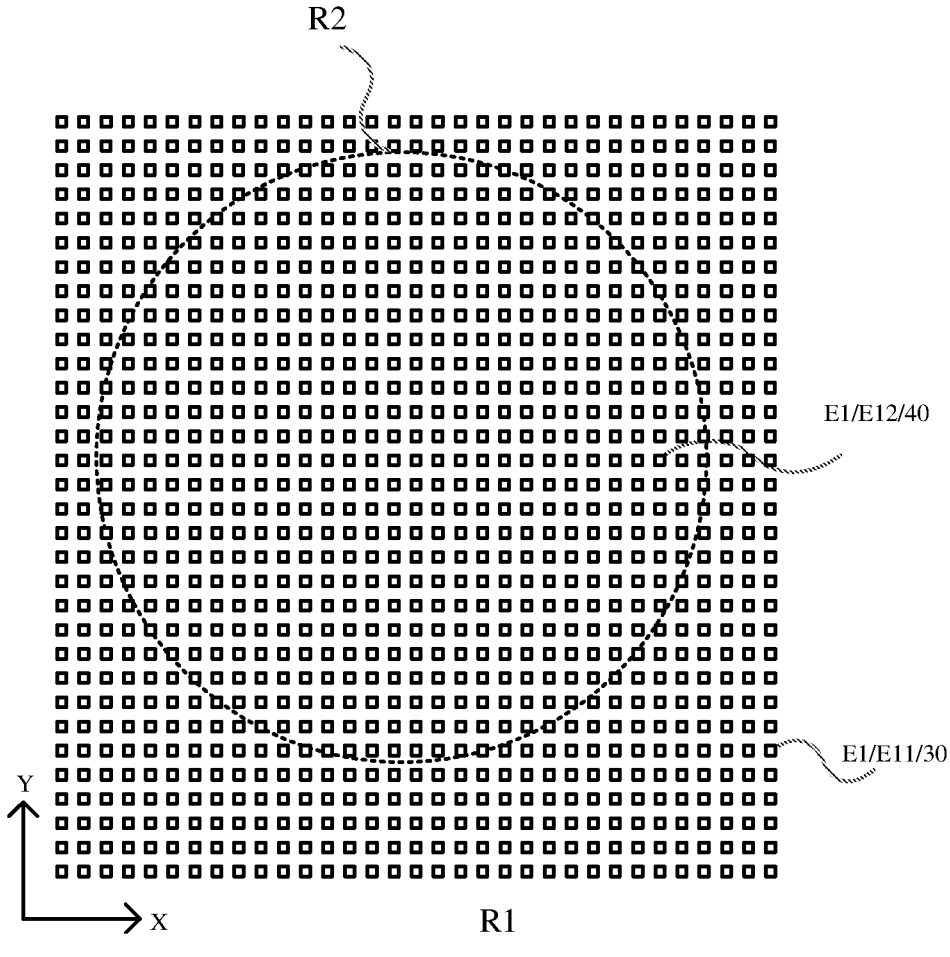
FIG. 7 is a schematic diagram of a first electrode of a light-emitting element in a display panel provided by an embodiment of the present disclosure.
Figure 8:
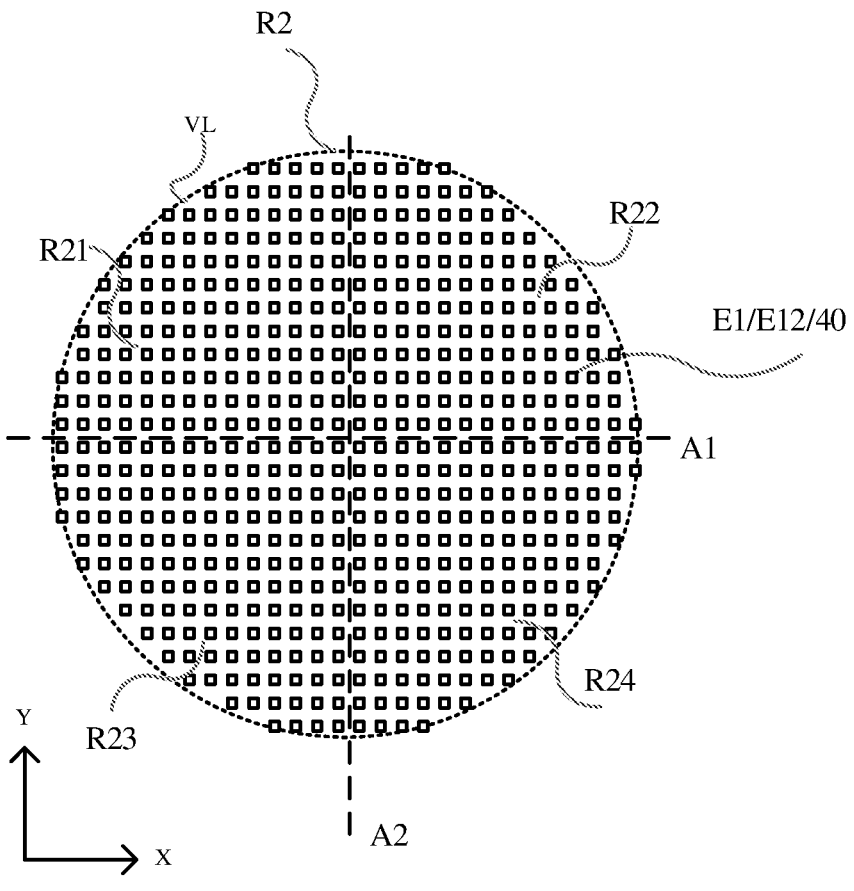
FIG. 8 is a schematic diagram of a second display region and a first electrode located in the second display region in a display panel provided by an embodiment of the present disclosure.

FIG. 6 is a schematic diagram of a first electrode of a light-emitting element in a display panel provided by an embodiment of the present disclosure. FIG. 7 is a schematic diagram of a first electrode of a light-emitting element in a display panel provided by an embodiment of the present disclosure. FIG. 8 is a schematic diagram of a second display region and a first electrode located in the second display region in a display panel provided by an embodiment of the present disclosure.

As shown in FIG. 6 and FIG. 7, the first electrode E1 includes a first electrode E11 and a first electrode E12, the first electrode E11 is located in the first display region R1, and the first electrode E12 is located in the second display region R2. The second display region R2 in FIG. 6 is in a rectangular shape, and the second display region R2 in FIG. 7 is in a circular shape. The shape of the second display region R2 is not limited in the embodiment of the present disclosure. For example, the shape of the second display region R2 can also be oval. The shape of the second display region R2 can be determined according to needs. In some embodiments of the present disclosure, a circular-shaped second display region R2 is described by way of example.

For example, for a square-shaped second display region R2 and a circular-shaped second display region R2, given the circular regions with the same diameter and given the same PPI, the number of the first electrodes E1 in the circular-shaped second display region R2 is about 21.46% smaller than the number of the first electrodes E1 in the square-shaped second display region R2, and the number of the conductive lines L1 that need to be set is relatively small. Therefore, in the case of high PPI, a circular-shaped second display region R2 can be selected.

For example, as shown in FIG. 8, the first display region R1 surrounds the second display region R2, and the shape of the second display region R2 is circular. As shown in FIG. 8, the second display region R2 is axisymmetric. As shown in FIG. 8, the second display region R2 includes a first symmetry axis A1 extending along the first direction X and a second symmetry axis A2 extending along the second direction Y.

FIG. 8 shows that the second display region R2 includes a first sub-region R21, a second sub-region R22, a third sub-region R23 and a fourth sub-region R24. As shown in FIG. 8, the first sub-region R21 and the second sub-region R22 are symmetrically arranged with respect to the second symmetry axis A2, and the third sub-region R23 and the fourth sub-region R24 are symmetrically arranged with respect to the second symmetry axis A2.

As shown in FIG. 8, the first sub-region R21 and the third sub-region R23 are symmetrically arranged with respect to the first symmetry axis A1, and the second sub-region R22 and the fourth sub-region R24 are symmetrically arranged with respect to the first symmetry axis A1.

The embodiments of the present disclosure are illustrated by taking that the first direction X is a row direction and the second direction Y is a column direction as an example. Of course, in some other embodiments, the first direction X can be the column direction and the second direction Y can be the row direction.

Referring to FIG. 3, the display panel includes a base substrate BS, a plurality of first pixel circuits 10, a plurality of first light-emitting elements 30, a plurality of second pixel circuits 20, a plurality of second light-emitting elements 40, and a plurality of conductive lines L1.

Referring to FIG. 1, FIG. 3, FIG. 4, FIG. 6 and FIG. 7, the base substrate BS has a first display region R1 and a second display region R2, and the first display region R1 is located at at least one side of the second display region R2.

Referring to FIG. 3, the plurality of first pixel circuits 10 are located in the first display region R1; the plurality of first light-emitting elements 30 are located in the first display region R1, and the first pixel circuit 10 is configured to drive at least one first light-emitting element 30.

Referring to FIG. 3, the plurality of second pixel circuits 20 are located in the first display region R1; the plurality of second light-emitting elements 40 are located in the second display region R2, and the second pixel circuit 20 is configured to drive at least one second light-emitting element 40.

Referring to FIG. 3, the second pixel circuit 20 is connected to the second light-emitting element 40 through at least one conductive line L1. FIG. 3 is illustrated by taking that one second pixel circuit 20 is connected to one second light-emitting element 40 through one conductive line L1 as an example.

Figure 9:
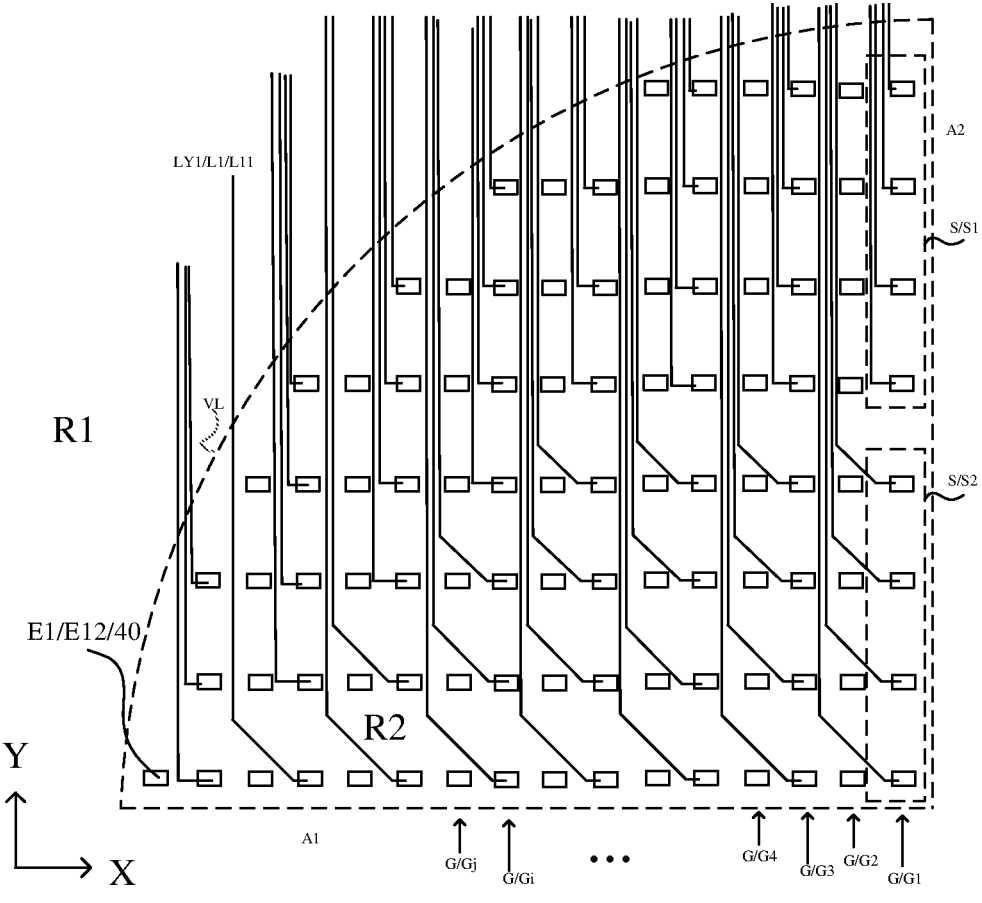
FIG. 9 is a partial view of a display panel provided by an embodiment of the present disclosure.
Figure 10:
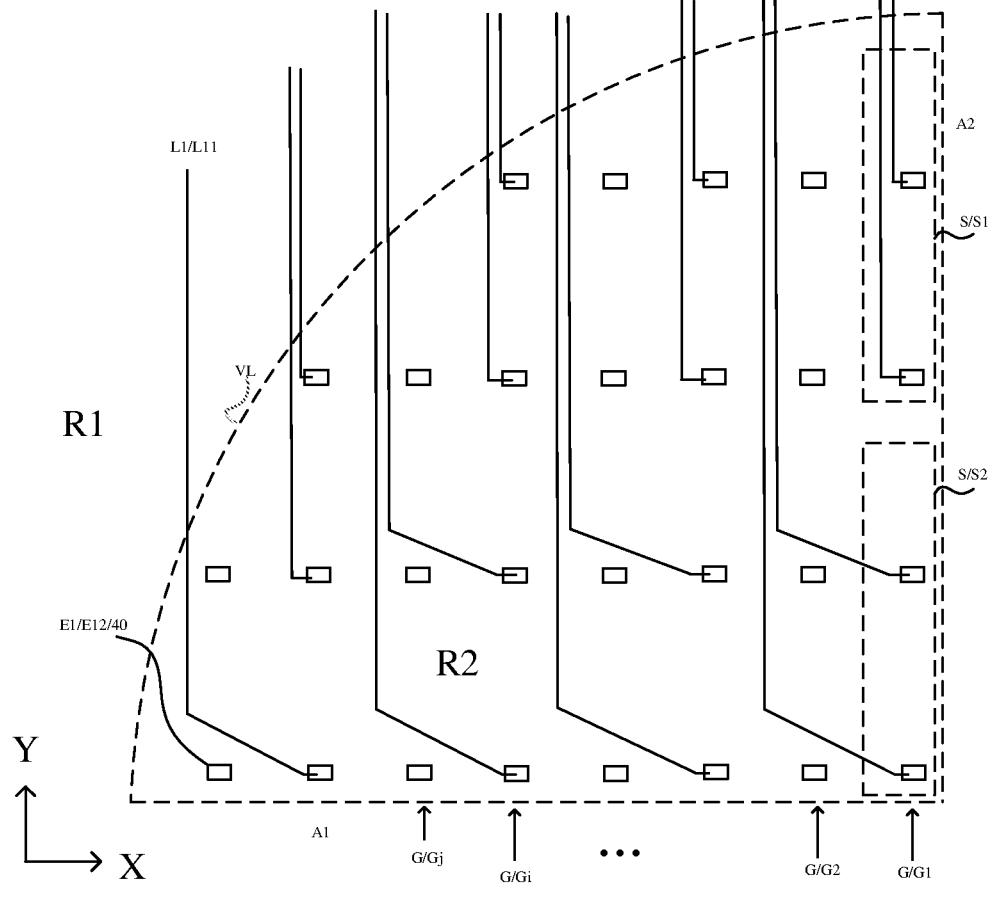
FIG. 10 is a partial view of a display panel provided by an embodiment of the present disclosure.
Figure 11:
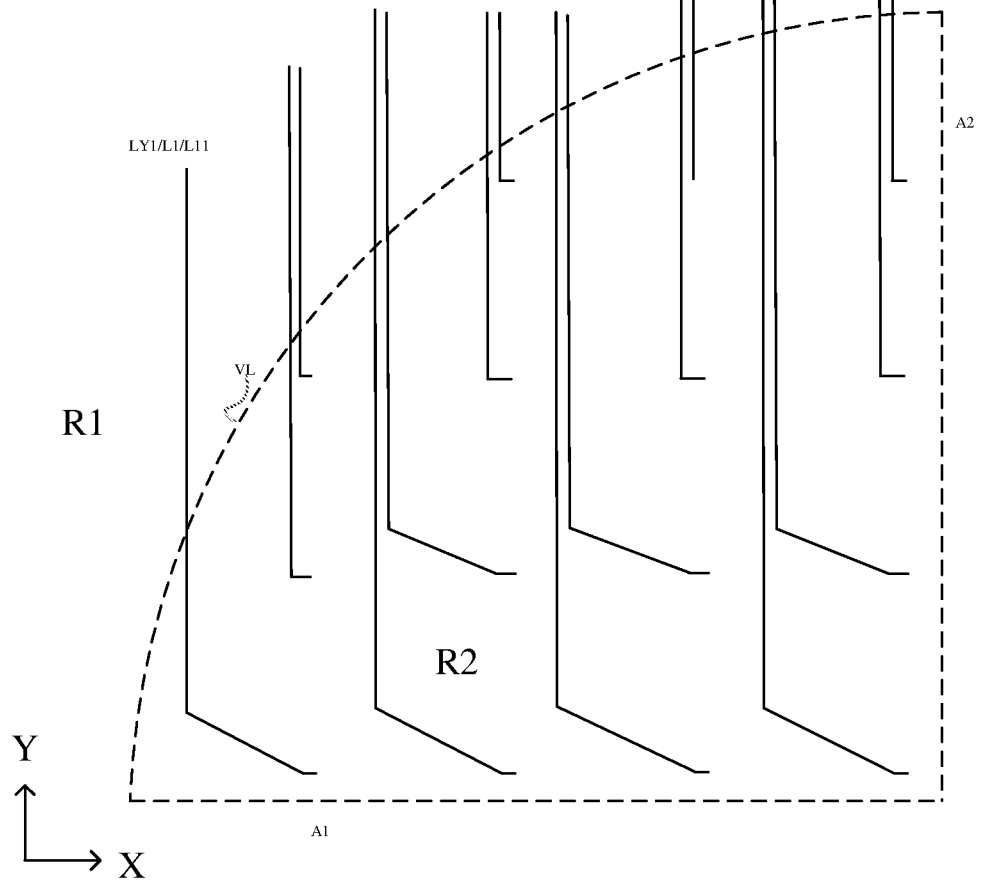
FIG. 11 is a schematic diagram of a conductive line in FIG. 10.

FIG. 9 is a partial view of a display panel provided by an embodiment of the present disclosure. FIG. 10 is a partial view of a display panel provided by an embodiment of the present disclosure. FIG. 11 is a schematic diagram of a conductive line in FIG. 10. FIG. 9 is a schematic diagram of the first sub-region R21 shown in FIG. 8. For clarity, the density of the first electrodes in the second display region R2 shown in FIG. 10 is half the density of the first electrodes in the second display region R2 shown in FIG. 9. In FIG. 9 and FIG. 10, one first electrode E12 corresponds to one light-emitting element 40 (referring to FIG. 3).

Figure 12:
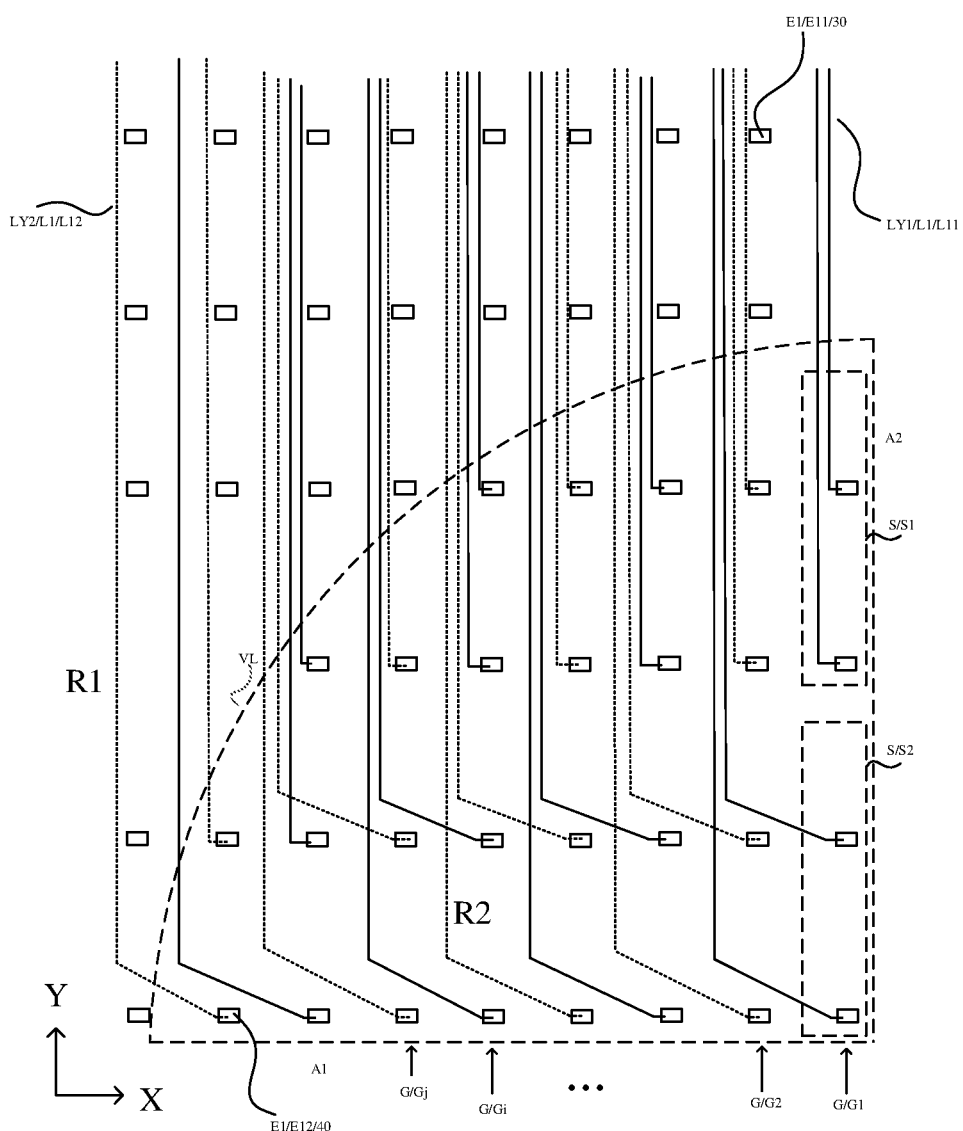
FIG. 12 is a partial view of a display panel provided by an embodiment of the present disclosure.

As shown in FIG. 9 and FIG. 12, the plurality of second light-emitting elements 40 include a plurality of groups G, at least one group of the plurality of groups includes a plurality of subgroups S, and each subgroup S includes at least one second light-emitting element 40. In a same group G, conductive lines L1 connected to second light-emitting elements 40 of different subgroups S are located between second light-emitting elements 40 of different adjacent groups.

As shown in FIG. 9 and FIG. 10, the plurality of groups G include a first group G1, a second group G2, an i-th group Gi, and a j-th group Gj, i is a natural number greater than or equal to 1, and j is a natural number greater than i. FIG. 9 shows 16 groups and FIG. 10 shows 8 groups. It should be noted that the number of the groups in the embodiment of the present disclosure is not limited to that shown in FIG. 9 or FIG. 10, but can be determined as needed. For example, as shown in FIG. 9 and FIG. 10, the plurality of groups G are arranged along the first direction X. For example, as shown in FIG. 9 and FIG. 10, each group extends along the second direction Y.

As shown in FIG. 9 and FIG. 10, the first group G1 includes two subgroups S, and the two subgroups S include a first subgroup S1 and a second subgroup S2. As shown in FIG. 9, in the first group G1, the first subgroup S1 includes four light-emitting elements 40, and the second subgroup S2 includes four light-emitting elements 40. As shown in FIG. 10, in the first group G1, the first subgroup S1 includes two light-emitting elements, and the second subgroup S2 includes two light-emitting elements. As shown in FIG. 9 and FIG. 10, in the first group G1, the plurality of subgroups S are arranged along the second direction Y. As shown in FIG. 9 and FIG. 10, the light-emitting elements in each subgroup S are arranged along the second direction Y.

As shown in FIG. 9 and FIG. 10, one light-emitting element 40 is connected to one conductive line L1. The conductive lines L1 shown in FIG. 9 are all located in a same layer, and the conductive line L1 shown in FIG. 9 can be referred to as a first conductive line L11. The conductive lines L1 shown in FIG. 10 are all located in a same layer, and the conductive line L1 shown in FIG. 10 can be referred to as a first conductive line L11. The first conductive line L11 is located in a first pattern layer LY1.

As shown in FIG. 9 and FIG. 10, the conductive lines L1 connected to the second light-emitting elements 40 in a same subgroup are located in a same layer. As shown in FIG. 9, the conductive lines L1 connected to the second light-emitting elements 40 in the first subgroup S1 are located in a same layer. As shown in FIG. 9, the conductive lines L1 connected to the second light-emitting elements 40 in the second subgroup S2 are located in a same layer. As shown in FIG. 9, the conductive lines L1 connected to the second light-emitting elements 40 in the same group G are located in a same layer.

As shown in FIG. 9 and FIG. 10, in a same group G, the conductive lines L1 connected to the second light-emitting elements 40 in different subgroups are located in a same layer.

As shown in FIG. 9, in the first group G1, the conductive lines L1 connected to the second light-emitting elements 40 of the first subgroup S1 are located between the first group G1 and the second group G2, and the conductive lines L1 connected to the second light-emitting elements 40 of the second subgroup S2 are located between the second group G2 and the third group G3. That is, the conductive lines L1 connected to the second light-emitting elements 40 of the first subgroup S1 in the first group G1 and the conductive lines L1 connected to the second light-emitting elements 40 of the second subgroup S2 in the first group G1 are located between the second light-emitting elements 40 of different adjacent groups.

In the display panel provided by the embodiment of the present disclosure, the conductive lines are distributed separately. As shown in FIG. 9, the conductive lines L1 connected to the second light-emitting elements 40 of the second subgroup S2 span the adjacent group G, that is, spanning the second group, so that a part of the conductive line L1 connected to the second light-emitting element 40 of the second subgroup S2 can be located between the second group G2 and the third group G3. Compared with the case where the conductive lines L1 connected to the second light-emitting elements 40 of all subgroups S in the same group G are all located between the second light-emitting elements 40 of the same adjacent groups, the wiring design of the conductive lines is facilitated. For example, the case where the conductive lines L1 connected to the second light-emitting elements 40 of all subgroups S in the same group G are all located between the second light-emitting elements 40 of the same adjacent groups includes that the conductive lines L1 connected to the second light-emitting elements 40 of the first subgroup S1 in the first group G1 are located between the first group G1 and the second group G2, and the conductive lines L1 connected to the second light-emitting elements 40 of the second subgroup S2 in the first group G1 are also located between the first group G1 and the second group G2.

The arrangement manner of conductive lines of other odd-numbered groups can refer to the arrangement of conductive lines of the first group, which will not be repeated here.

As shown in FIGS. 9-12, in the same group G, the conductive lines L1 connected to the second light-emitting elements 40 of a same subgroup S are located between the second light-emitting elements 40 of the same adjacent groups. For example, as shown in FIG. 9 and FIG. 12, for the first group G1, the conductive lines L1 connected to the second light-emitting elements 40 of the first subgroup S1 are all located between the second light-emitting elements 40 of the first group G1 and the second light-emitting elements 40 of the second group G2. The second light-emitting elements 40 of the first group G1 are adjacent to the second light-emitting elements 40 of the second group G2. For example, as shown in FIG. 9 and FIG. 12, for the first group G1, the conductive lines L1 connected to the second light-emitting elements 40 of the second subgroup S2 are all located between the second light-emitting elements 40 of the third group G3 and the second light-emitting elements 40 of the second group G2. The second light-emitting elements 40 of the third group G3 are adjacent to the second light-emitting elements 40 of the second group G2. The arrangement manner of conductive lines connected to the second light-emitting elements of other groups can refer to the arrangement manner of the conductive lines connected to the second light-emitting elements of the first group G1.

FIGS. 9-11 show conductive lines connected to light-emitting elements in odd-numbered columns, but do not show conductive lines connected to light-emitting elements in even-numbered columns. The conductive lines connected to the light-emitting elements of even-numbered columns can refer to FIG. 12 and FIG. 15 in the following. FIGS. 9-11 do not show the first electrode in the first display region, and the first electrode in the first display region can refer to FIG. 12 in the following.

Figure 13:
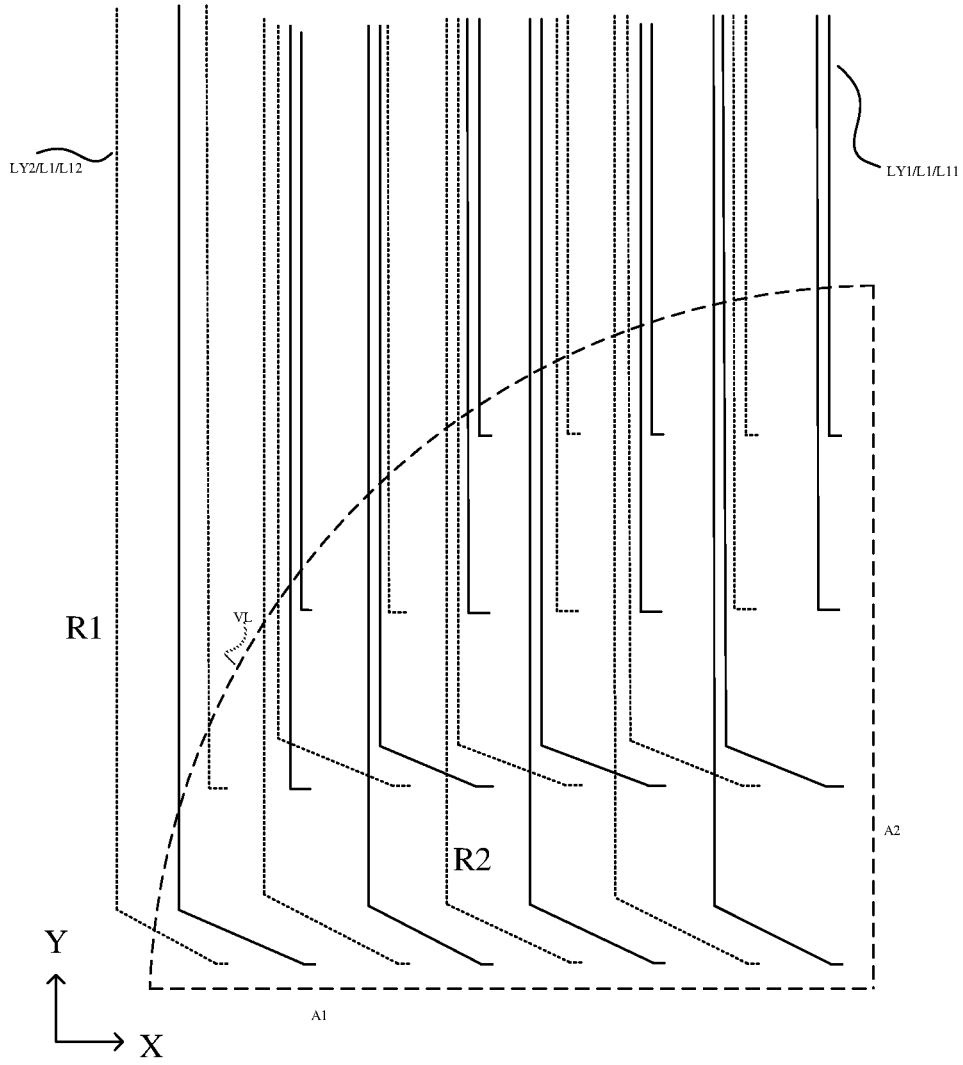
FIG. 13 is a schematic diagram of a conductive line in FIG. 12.
Figure 14:
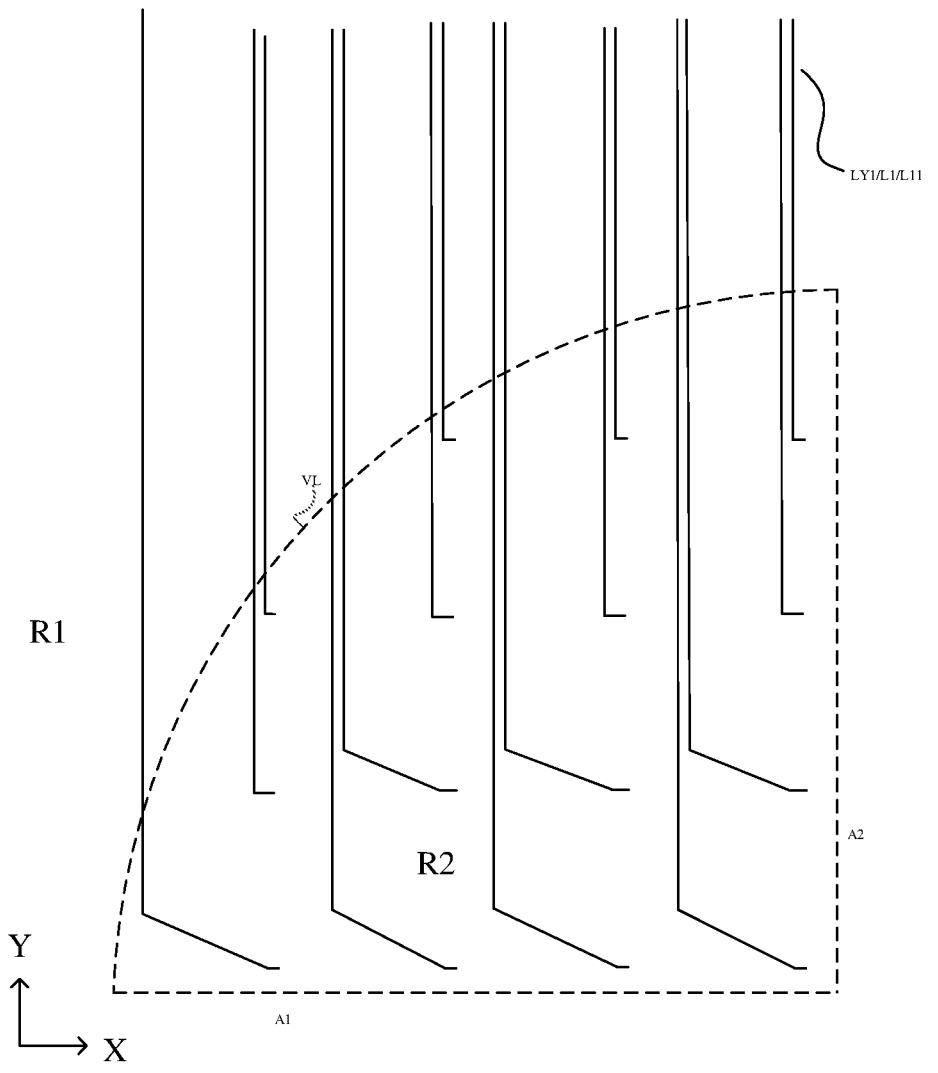
FIG. 14 is a schematic diagram of a first conductive line in FIG. 12.
Figure 15:
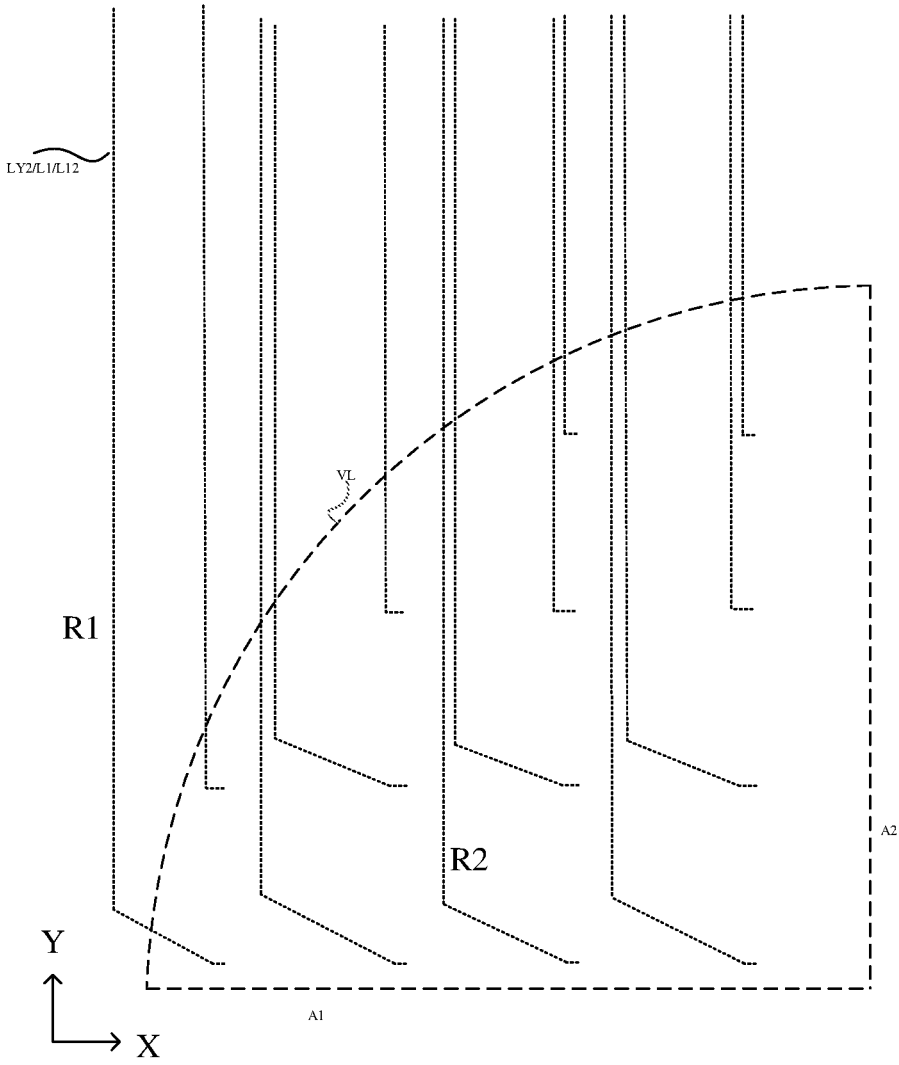
FIG. 15 is a schematic diagram of a second conductive line in FIG. 12.
Figure 16:
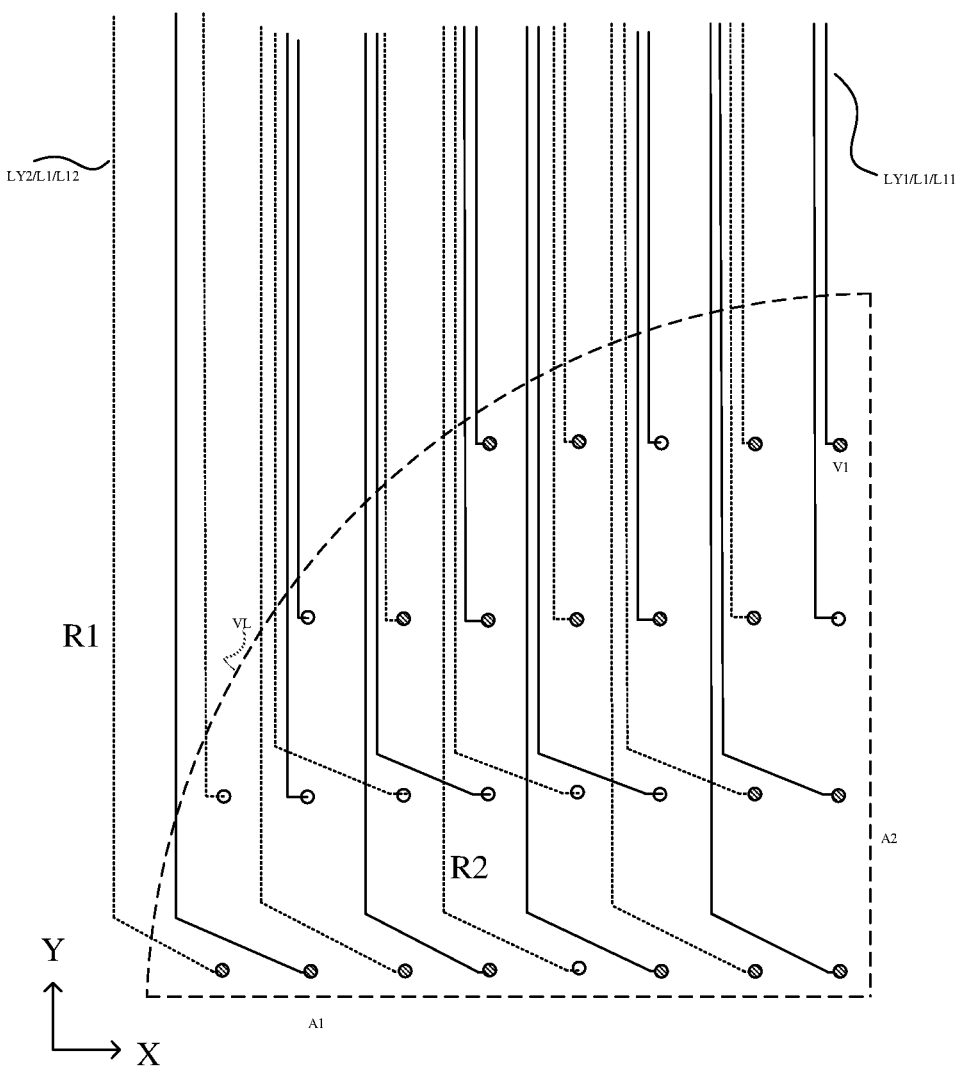
FIG. 16 is a schematic diagram of a via hole for connecting a first electrode and a conductive line.
Figure 17:
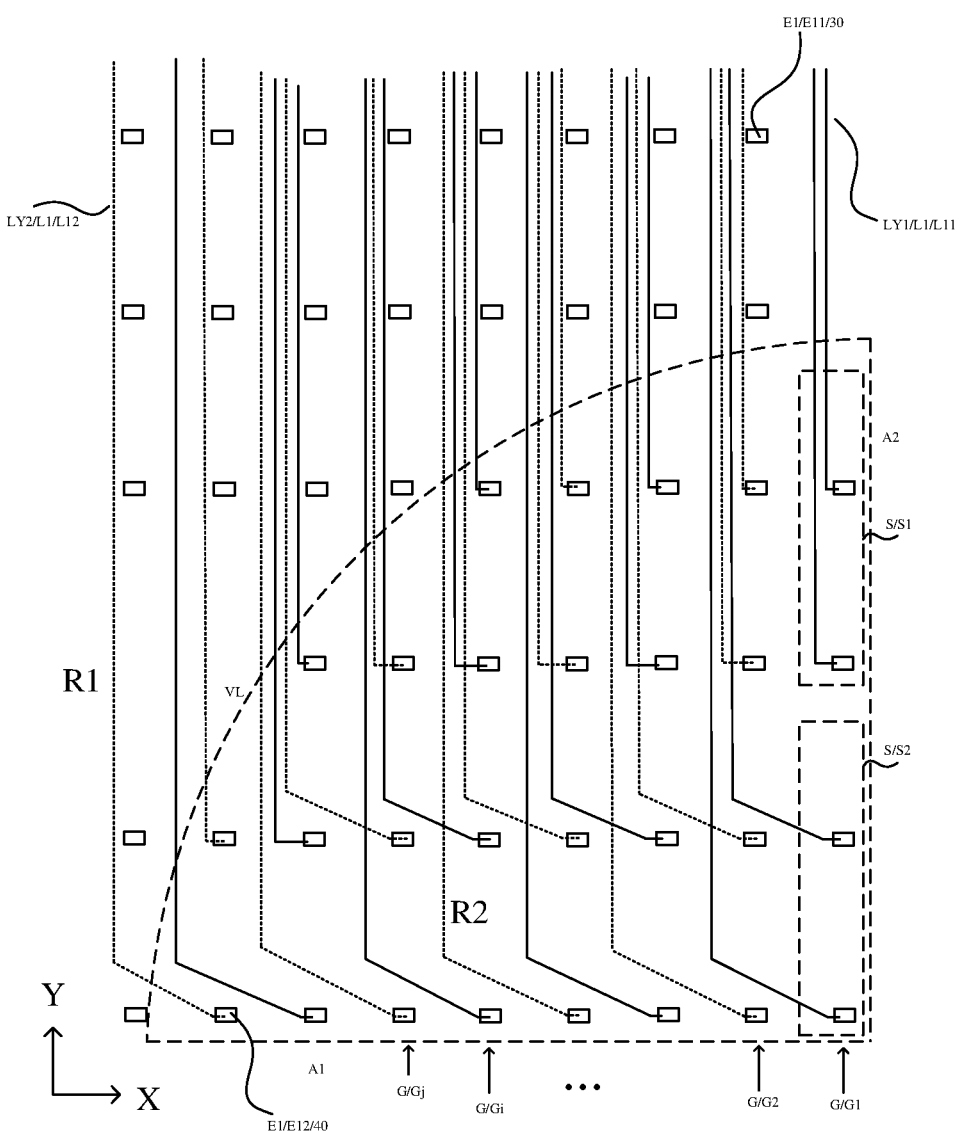
FIG. 17 is a partial view of a display panel provided by another embodiment of the present disclosure.
Figure 18A:
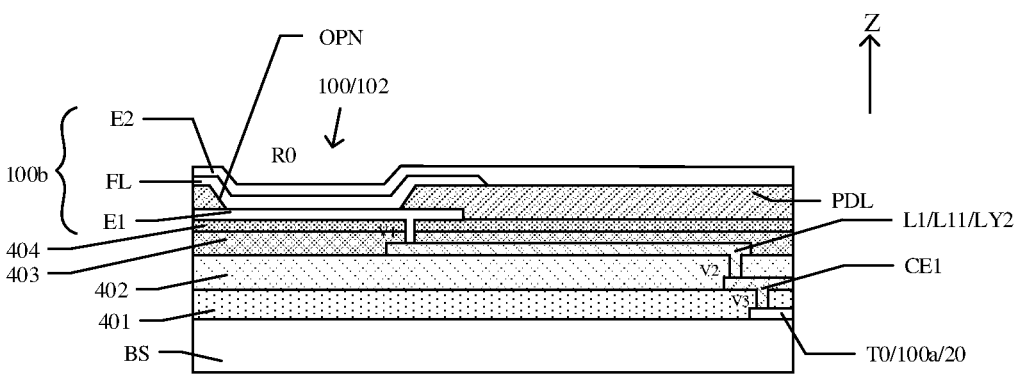
FIG. 18A is a cross-sectional view of a display panel provided by an embodiment of the present disclosure.
Figure 18B:
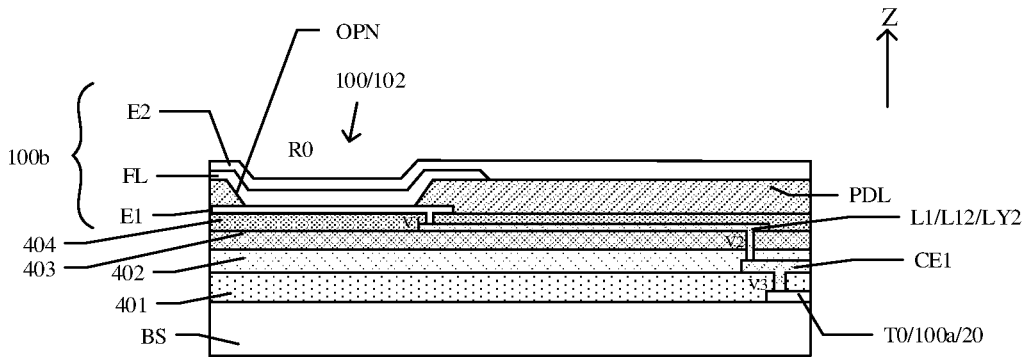
FIG. 18B is a cross-sectional view of a display panel provided by an embodiment of the present disclosure.

FIG. 12 is a partial view of a display panel provided by an embodiment of the present disclosure. FIG. 13 is a schematic diagram of a conductive line in FIG. 12. FIG. 14 is a schematic diagram of a first conductive line in FIG. 12. FIG. 15 is a schematic diagram of a second conductive line in FIG. 12. FIG. 16 is a schematic diagram of a via hole for connecting a first electrode and a conductive line. For clarity, FIGS. 12-15 do not show the via hole for connecting the first electrode and the conductive line. FIG. 17 is a partial view of a display panel provided by another embodiment of the present disclosure. FIG. 18A is a cross-sectional view of a display panel provided by an embodiment of the present disclosure. FIG. 18B is a cross-sectional view of a display panel provided by an embodiment of the present disclosure.

For example, in the embodiment of the present disclosure, one group of light-emitting elements can also be regarded as one group of first electrodes E1. The conductive line L1 connected to the light-emitting element is just the conductive line L1 connected to the first electrode E1 of the light-emitting element.

Referring to FIGS. 12-15, the first electrodes E1 of the first group G1 are connected out one by one with the first conductive lines L11 from right to left.

The gap between the first electrodes E1 of the first group G1 and the first electrodes E1 of the second group G2 is covered with the first conductive lines L11 connected to the first electrodes E1 of the first subgroup S1 of the first group G; the first conductive lines L11 connected to the first electrodes E1 of the second subgroup S2 of the first group G skip the first electrodes E1 of the second group G2, and are arranged in the gap between the first electrodes E1 of the second group G2 and the first electrodes E1 of the third group G3. Thus, the first conductive lines L11 connected to the first electrodes E1 of odd-numbered groups are periodically designed. The second conductive line L12 is designed in the same way as the first conductive line L11, except that the second conductive line L12 is connected to the first electrode E1 of even-numbered group. The design of the conductive lines L1 in the whole second display region can be obtained by the same method or by the leftwards, rightwards, upwards and downwards mirroring processing.

The same group of light-emitting elements can be regarded as the same column of light-emitting elements, and the same group of first electrodes can be regarded as the same column of first electrodes. For example, in the same group, conductive lines connected to second light-emitting elements of different subgroups being located between second light-emitting elements of different adjacent groups includes the case that, in the same column, conductive lines connected to second light-emitting elements of different subgroups are located between second light-emitting elements of different adjacent columns.

For example, when the conductive lines are formed by two pattern layers, that is, formed by the first conductive line L11 and the second conductive line L1, in order to reduce the loading between the conductive lines, the first conductive lines L11 are routed in the gaps between the second conductive lines L12, and the second conductive lines L12 are routed in the gaps between the first conductive lines L11, so as to minimize the overlap between the two layers.

For clarity, FIG. 12 is illustrated by taking the case where the parts of different conductive lines L1 extending in the second direction Y are not overlapped, and the conductive lines located in the same layer are close to each other, as an example, which can be appropriately adjusted in some other embodiments. For example, as shown in FIG. 17, in order to facilitate manufacturing, among the conductive lines L1 between two adjacent groups, conductive lines located in different layers are alternately arranged in the first direction X.

FIG. 18A shows a first conductive line L11. FIG. 18B shows a second conductive line L12. The first conductive line L11 is located in the first pattern layer LY1, and the second conductive line L12 is located in the second pattern layer LY2.

Referring to FIG. 16, FIG. 18A and FIG. 18B, the first electrode E1 is connected to the conductive line L1 through a via hole V1. Referring to FIG. 16 and FIG. 18A, the first electrode E1 is connected to the conductive line L1 through a via hole V1 penetrating through the insulating layer 403 and the insulating layer 404. Referring to FIG. 16 and FIG. 18B, the first electrode E1 is connected to the conductive line L1 through a via hole V1 penetrating through the insulating layer 404.

Referring to FIG. 18A and FIG. 18B, the conductive line L1 is connected to the transfer electrode CE1 through a via hole V2, and the transfer electrode CE1 is connected to the second pixel circuit 20 through a via hole V3.

Referring to FIG. 18A, the via hole V2 penetrates through the insulating layer 402, and the via hole V3 penetrates through the insulating layer 401. Referring to FIG. 18B, the via hole V2 penetrates through the insulating layer 403 and the insulating layer 402, and the via hole V3 penetrates through the insulating layer 401.

Figure 19:
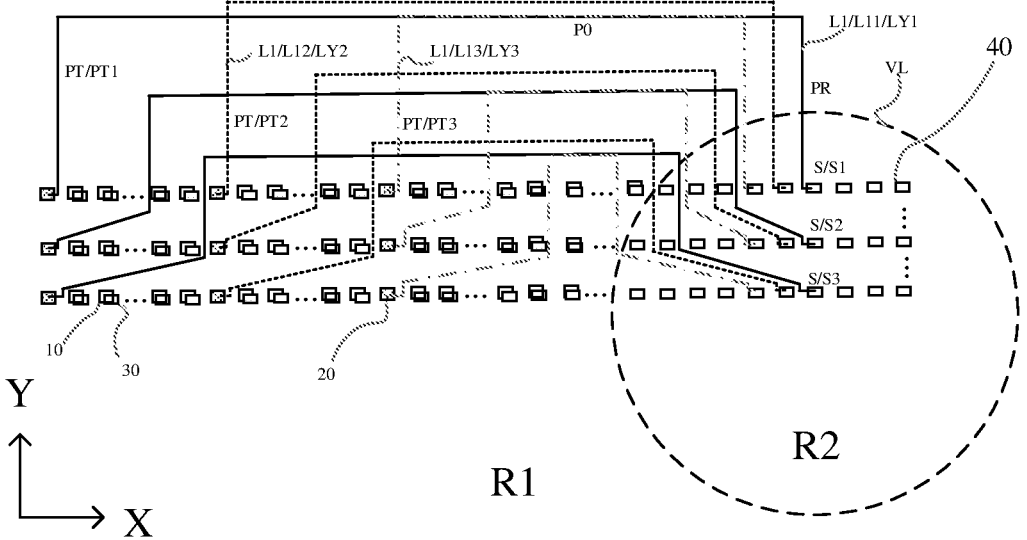
FIG. 19 is a partial view of a display panel provided by an embodiment of the present disclosure.
Figure 20:
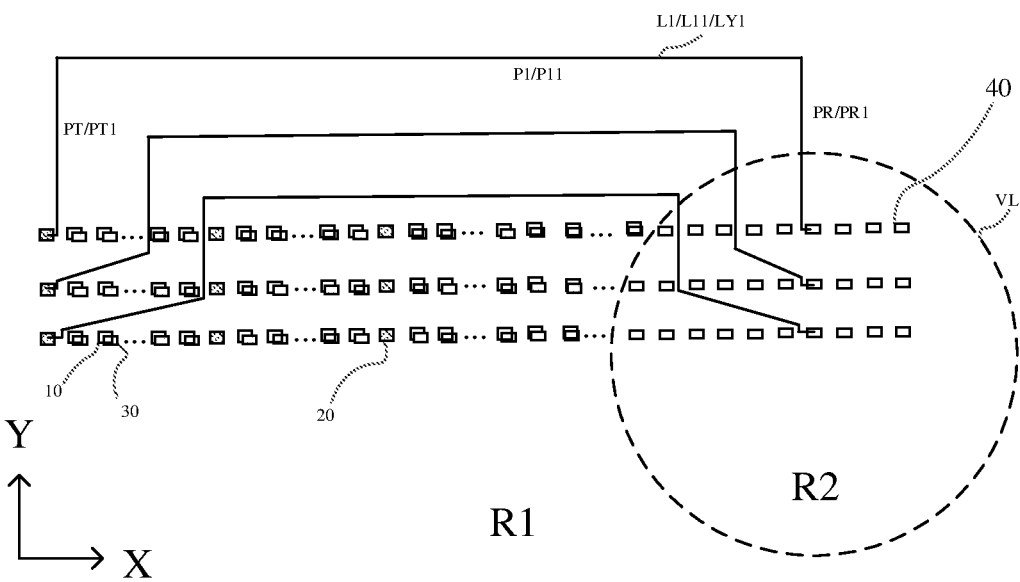
FIG. 20 is a schematic diagram of a first conductive line as well as a second pixel circuit and a second light-emitting element respectively connected to the first conductive line in FIG. 19.
Figure 21:
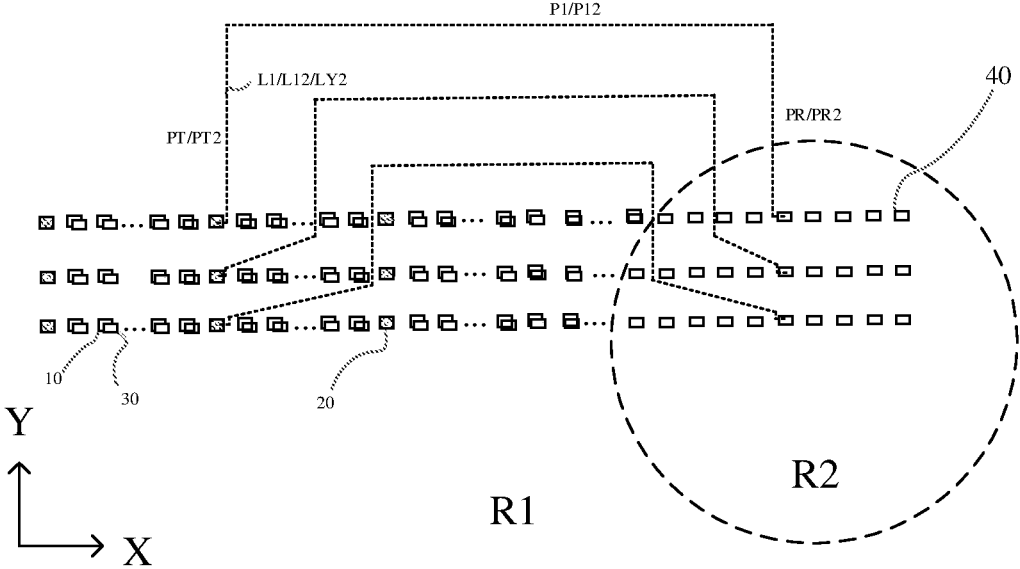
FIG. 21 is a schematic diagram of a second conductive line as well as a second pixel circuit and a second light-emitting element respectively connected to the second conductive line in FIG. 19.
Figure 22:
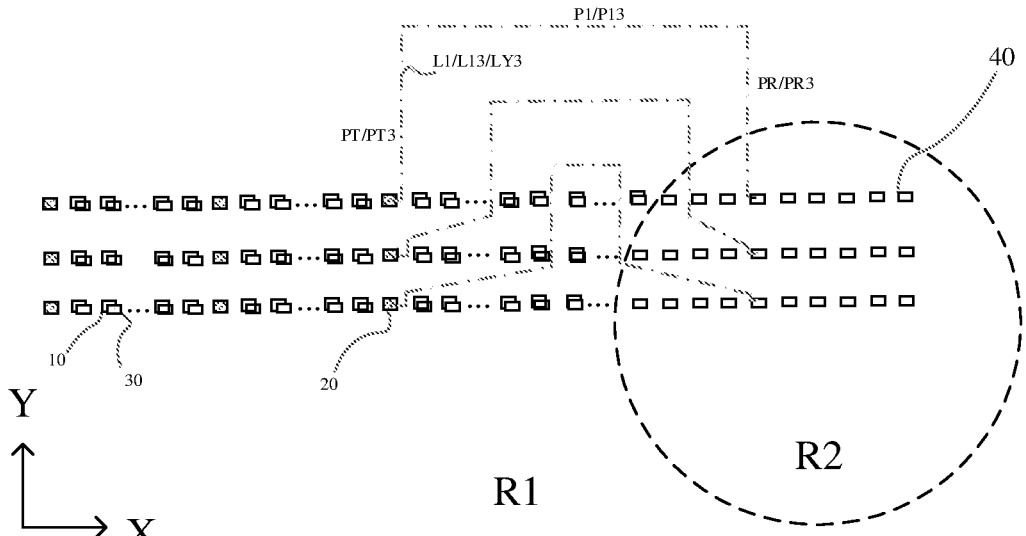
FIG. 22 is a schematic diagram of a third conductive line as well as a second pixel circuit and a second light-emitting element respectively connected to the third conductive line in FIG. 19.
Figure 23:
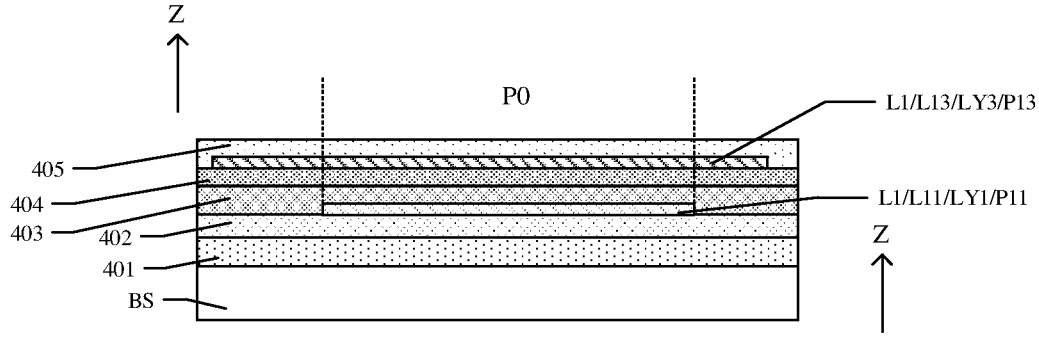
FIG. 23 is a schematic diagram of at least two insulating layers disposed between two overlapped conductive lines.

FIG. 19 is a partial view of a display panel provided by an embodiment of the present disclosure. FIG. 20 is a schematic diagram of a first conductive line as well as a second pixel circuit and a second light-emitting element respectively connected to the first conductive line in FIG. 19. FIG. 21 is a schematic diagram of a second conductive line as well as a second pixel circuit and a second light-emitting element respectively connected to the second conductive line in FIG. 19. FIG. 22 is a schematic diagram of a third conductive line as well as a second pixel circuit and a second light-emitting element respectively connected to the third conductive line in FIG. 19. FIG. 23 is a schematic diagram of at least two insulating layers disposed between two overlapped conductive lines.

As shown in FIG. 19, different conductive lines L1 may be intersected or overlapped, but there is an insulating layer between different conductive lines at the overlapping and intersecting position, different conductive lines L1 are insulated from each other, and different conductive lines L1 are not electrically connected.

Referring to FIG. 19 and FIG. 20, the first conductive line L11 is located in the first pattern layer LY1. Referring to FIG. 19 and FIG. 21, the second conductive line L12 is located in the second pattern layer LY2. Referring to FIG. 19 and FIG. 22, the third conductive line L13 is located in the third pattern layer LY3. In the embodiment of the present disclosure, the case where one conductive line is formed by a material of the same pattern layer is described by way of example; and it should be noted that, in some other embodiments, one same conductive line can also be formed by materials of different pattern layers, and the parts located in different pattern layers are connected through via holes penetrating through the insulating layer.

Referring to FIG. 19, the second light-emitting elements 40 in the same column are respectively connected to the second pixel circuits 20 in the same column. Referring to FIG. 19, the second light-emitting elements 40 in the same row are respectively connected to the second pixel circuits 20 in the same row. FIG. 19 illustrates the case where the second pixel circuit 20 is located in the first display region R1 by way of example. In some other embodiments, the second pixel circuit 20 can be located in the peripheral region.

Referring to FIG. 9, FIG. 12 and FIG. 19, the plurality of subgroups S include a first subgroup S1 and a second subgroup S2, and the conductive lines L1 connected to the second light-emitting elements 40 in the first subgroup S1 and the conductive lines L1 connected to the second light-emitting elements 40 in the second subgroup S2 are separated by at least one group of second light-emitting elements 40. For example, the conductive lines L1 connected to the second light-emitting elements 40 in the first subgroup S1 and the conductive lines L1 connected to the second light-emitting elements 40 in the second subgroup S2 are separated by at least one group of second light-emitting elements 40 in the first direction X. The display panel shown in FIG. 9 and FIG. 12 illustrates the case where the conductive lines L1 connected to the second light-emitting elements 40 in the first subgroup S1 and the conductive lines L1 connected to the second light-emitting elements 40 in the second subgroup S2 are separated by one group of second light-emitting elements 40 by way of example. The display panel shown in FIG. 19 illustrates the case where the conductive lines L1 connected to the second light-emitting elements 40 in the first subgroup S1 and the conductive lines L1 connected to the second light-emitting elements 40 in the second subgroup S2 are separated by two groups of second light-emitting elements 40 by way of example.

For example, the display panel includes at least two overlapped conductive lines L1, and overlapping portions of two conductive lines of the at least two overlapped conductive lines L1 extend along the first direction X. Referring to FIGS. 19-22, the conductive line L1 includes a portion P1 extending in the first direction X, and the portions P1 of different conductive lines L1 extending in the first direction X are overlapped. As shown in FIG. 9, the first conductive line L11 has a portion P11 extending in the first direction X, the second conductive line L12 has a portion P12 extending in the first direction X, and the third conductive line L13 has a portion P13 extending in the first direction X. Referring to FIGS. 19-22, the first conductive line L11 and the third conductive line L13 have overlapping portions P0. Referring to FIGS. 19-22, the portion P12 of the second conductive line L12 extending in the first direction X does not overlap with the portion P11 of the first conductive line L11 extending in the first direction X, and the portion P12 of the second conductive line L12 extending in the first direction X does not overlap with the portion P13 of the third conductive line L13 extending in the first direction X.

For example, at least two insulating layers are disposed between the two overlapped conductive lines. As shown in FIG. 23, at least two insulating layers are disposed between the two overlapped conductive lines L1. As shown in FIG. 23, at least two insulating layers are disposed between the overlapping portions P0 of the two conductive lines L1. As shown in FIG. 19 and FIG. 23, the first conductive line L11 overlaps with the third conductive line L13 in the direction perpendicular to the base substrate (third direction Z). As shown in FIG. 23, an insulating layer 403 and an insulating layer 404 are disposed between the first conductive line L11 and the third conductive line L13. As shown in FIG. 23, an insulating layer 405 is disposed on the third conductive line L13. For example, the first electrode of a light-emitting element is connected to the first conductive line L11 through a via hole penetrating through the insulating layer 405, the insulating layer 404 and the insulating layer 403, the first electrode of a light-emitting element is connected to the second conductive line L12 through a via hole penetrating through the insulating layer 405 and the insulating layer 404, and the first electrode of a light-emitting element is connected to the third conductive line L13 through a via hole penetrating through the insulating layer 405.

For example, a component A overlapping with a component B, or the component A overlapping with the component B in the direction perpendicular to the base substrate, means that the orthographic projection of the component A on the base substrate overlaps with the orthographic projection of the component B on the base substrate.

Referring to FIG. 19, the plurality of subgroups S further include a third subgroup S3; the first subgroup S1, the second subgroup S2 and the third subgroup S3 are arranged in sequence; a portion PR, passing through the virtual dividing line VL between the first display region R1 and the second display region R2, of the conductive line L1 connected to the second light-emitting element 40 in the second sub-group S2, and a portion PR, passing through the virtual dividing line VL between the first display region R1 and the second display region R2, of the conductive line L1 connected to the second light-emitting element 40 in the third sub-group S3, are separated by at least one group of second light-emitting elements 40. FIGS. 8-17 also show the virtual dividing line VL. For example, the virtual dividing line VL can be a boundary line between the first display region R1 and the second display region R2, and the virtual dividing line VL is a virtual line that may not exist in the final product.

Referring to FIG. 19 and FIG. 20, a portion PR1, passing through the virtual dividing line VL between the first display region R1 and the second display region R2, of the first conductive line L11 connected to the second light-emitting element 40 in the second subgroup S2, and a portion PR1, passing through the virtual dividing line VL between the first display region R1 and the second display region R2, of the first conductive line L11 connected to the second light-emitting element 40 in the third subgroup S3, are separated by two groups of second light-emitting elements 40.

Referring to FIG. 19 and FIG. 21, a portion PR2, passing through the virtual dividing line VL between the first display region R1 and the second display region R2, of the second conductive line L12 connected to the second light-emitting element 40 in the second subgroup S2, and a portion PR2, passing through the virtual dividing line VL between the first display region R1 and the second display region R2, of the second conductive line L12 connected to the second light-emitting element 40 in the third subgroup S3, are separated by two groups of second light-emitting elements 40.

Referring to FIG. 19 and FIG. 22, a portion PR3, passing through the virtual dividing line VL between the first display region R1 and the second display region R2, of the third conductive line L13 connected to the second light-emitting element 40 in the second subgroup S2, and a portion PR3, passing through the virtual dividing line VL between the first display region R1 and the second display region R2, of the third conductive line L13 connected to the second light-emitting element 40 in the third subgroup S3, are separated by two groups of second light-emitting elements 40.

Referring to FIGS. 19-22, the plurality of second pixel circuits 20 are distributed, at intervals, among the plurality of first pixel circuits 10. In the same row of pixel units, multiple first pixel circuits 10 are arranged between two adjacent second pixel circuits 20.

Referring to FIG. 3 and FIG. 22, at least one first pixel circuit 10 of the plurality of first pixel circuits 10 can be connected to at least one first light-emitting element 30 of the plurality of first light-emitting elements 30, and the orthographic projection of the at least one first pixel circuit 10 on the base substrate BS at least partially overlaps with the orthographic projection of the at least one first light-emitting element 30 on the base substrate BS.

Referring to FIG. 3 and FIG. 22, at least one second pixel circuit 20 of the plurality of second pixel circuits 20 is connected to at least one second light-emitting element 40 of the plurality of second light-emitting elements 40 through at least one conductive line L1. Referring to FIG. 3 and FIG. 22, the orthogonal projections of the plurality of second pixel circuits 20 on the base substrate BS do not overlap with the orthographic projections of the plurality of second light-emitting elements 40 on the base substrate BS.

Referring to FIGS. 9-23, the plurality of conductive lines L1 include a plurality of first conductive lines L1 located in the first pattern layer LY1, a plurality of second conductive lines L1 located in the second pattern layer LY2, and a plurality of third conductive lines L1 located in the third pattern layer LY3. The first pattern layer LY1, the second pattern layer LY2, and the third pattern layer LY3 are sequentially arranged, and the orthographic projection of one first conductive line L1 in the first pattern layer LY1 on the base substrate BS partially overlaps with the orthographic projection of one third conductive line L1 in the third pattern layer LY3 on the base substrate BS.

For example, the first pattern layer LY1, the second pattern layer LY2, and the third pattern layer LY3 are all transparent conductive layers.

For example, in the case where the space of the conductive lines is insufficient, the loading of the conductive lines can be reduced by overlapping the conductive lines which are farther away from each other in the direction perpendicular to the base substrate. For example, in the case where three pattern layers are included, the second conductive line L12 located in the middle is preferred to have no overlap with the first conductive line L11, and is also preferred to have no overlap with the third conductive line L13. The first conductive line L11 and the third conductive line L13 that have a larger vertical distance there-between can be overlapped.

Referring to FIG. 12, the density of the first electrodes E1 in the second display region R2 is the same as the density of the first electrodes E1 in the first display region. That is, the resolution of the second display region R2 is the same as the resolution of the first display region, and the embodiments of the present disclosure include but are not limited to this case.

FIG. 24 is a schematic diagram of a manufacturing method of a display panel provided by an embodiment of the present disclosure. As shown in FIG. 24, the manufacturing method of the display panel provided by an embodiment of the present disclosure includes the following steps.

Step 101: forming a pixel circuit on a base substrate, wherein the base substrate includes a first display region and a second display region, the pixel circuit includes a first pixel circuit and a second pixel circuit, the first pixel circuit is located in the first display region, and the second pixel circuit is also located in the first display region.

Step 102: forming a first insulating layer and forming a transfer electrode on the first insulating layer, wherein the transfer electrode includes a first transfer electrode and a second transfer electrode, the first transfer electrode is connected to the first pixel circuit, and the second transfer electrode is connected to the second pixel circuit.

Step 103: forming a second insulating layer is on the transfer electrode, and forming a conductive line on the second insulating layer, wherein one end of the conductive line is connected to the second transfer electrode; the forming the conductive line includes forming a first conductive line on the second insulating layer, forming a third insulating layer on the first conductive line, and forming a second conductive line on the third insulating layer.

Step 104: forming a fourth insulating layer on the conductive line.

Step 105: forming a first electrode on the fourth insulating layer, wherein the first electrode in the second display region is connected to the other end of the conductive line through a via hole penetrating through the fourth insulating layer, and the first electrode located in the first display region is connected to the first transfer electrode.

Step 106: forming a pixel defining layer on the first electrode, forming a light-emitting functional layer and a second electrode, and forming an encapsulation layer.

For example, the encapsulation layer is configured to encapsulate the light-emitting element to avoid invasion of water and oxygen.

For example, the display panel formed by the manufacturing method shown in FIG. 24 can be the display panel as shown in FIG. 9, FIG. 12, FIG. 18A and FIG. 18B. The first insulating layer can be the insulating layer 401 shown in FIG. 18A and FIG. 18B, the second insulating layer can be the insulating layer 402 shown in FIG. 18A and FIG. 18B, the third insulating layer can be the insulating layer 403 shown in FIG. 18A and FIG. 18B, and the fourth insulating layer can be the insulating layer 404 shown in FIG. 18A and FIG. 18B. The first transfer electrode can be the transfer electrode CE1 shown in FIG. 5. The second transfer electrode can be the transfer electrode CE2 shown in FIG. 5.

In the embodiment of the present disclosure, the conductive lines located in different layers are represented by lines in different forms. For example, the first conductive line L11 is represented by a black line, the second conductive line L12 is represented by a dashed line, and the third conductive line L13 is represented by a dot-and-dash line.

For example, the display panel provided by the embodiment of the present disclosure is described with reference to the arrangement manner of the conductive lines connected to the first electrodes in the first sub-region R21 at the upper left corner of the second display region R2 by way of example, and the arrangement manners of the conductive lines connected to the first electrodes in the second sub-region R22, in the third sub-region R23 and in the fourth sub-region R24 can be obtained by mirroring processing.

As shown in FIGS. 19-22, the conductive line L1 further has a portion PT located only in the first display region R1, and located between adjacent pixel circuits 100a in the first direction X. For example, in order to facilitate the layout design, adjacent portions PT of conductive lines connected to the same subgroup S1 are separated by at least one pixel circuit in the first direction X. Of course, adjacent portions PT of conductive lines connected to the same subgroup S1 may not be separated by any pixel circuit in the first direction X.

FIG. 25 is a schematic diagram of a manufacturing method of a display panel provided by an embodiment of the present disclosure. As shown in FIG. 25, the manufacturing method of the display panel provided by an embodiment of the present disclosure includes the following steps.

Step 201: forming a pixel circuit on a base substrate, wherein the base substrate includes a first display region and a second display region, the pixel circuit includes a first pixel circuit and a second pixel circuit, the first pixel circuit is located in the first display region, and the second pixel circuit is also located in the first display region.

Step 202: forming a first insulating layer and forming a transfer electrode on the first insulating layer, wherein the transfer electrode includes a first transfer electrode and a second transfer electrode, the first transfer electrode is connected to the first pixel circuit, and the second transfer electrode is connected to the second pixel circuit.

Step 203: forming a second insulating layer on the transfer electrode, and forming a conductive line on the second insulating layer, wherein one end of the conductive line is connected to the second transfer electrode; the forming the conductive line includes forming a first conductive line on the second insulating layer, forming a third insulating layer on the first conductive line, forming a second conductive line on the third insulating layer, forming a fourth insulating layer on the second conductive line, and forming a third conductive line on the fourth insulating layer.

Step 204: forming a fifth insulating layer on the conductive line.

Step 205: forming a first electrode on the fifth insulating layer, wherein the first electrode located in the second display region is connected to the other end of the conductive line through a via hole penetrating through the fifth insulating layer, and the first electrode located in the first display region is connected to the first transfer electrode.

Step 206: forming a pixel defining layer on the first electrode, forming a light-emitting functional layer and a second electrode, and forming an encapsulation layer.

For example, the display panel formed by the manufacturing method shown in FIG. 25 can be the display panel as shown in FIG. 23. In the display panel formed by the manufacturing method shown in FIG. 25, the first insulating layer can be the insulating layer 401 shown in FIG. 23, the second insulating layer can be the insulating layer 402 shown in FIG. 23, the third insulating layer can be the insulating layer 403 shown in FIG. 23, the fourth insulating layer can be the insulating layer 404 shown in FIG. 23, and the fifth insulating layer can be the insulating layer 405 shown in FIG. 23. The first transfer electrode can be the transfer electrode CE1 shown in FIG. 5. The second transfer electrode can be the transfer electrode CE2 shown in FIG. 5.

For example, in some embodiments of the present disclosure, the first direction X and the second direction Y are directions parallel to the main surface of the base substrate, and the third direction Z is a direction perpendicular to the main surface of the base substrate. The main surface of the base substrate is the surface on which various components are manufactured. The upper surface of the base substrate in the cross-sectional view is the main surface thereof. For example, the first direction X is intersected with the second direction Y. Further, for example, the first direction X is perpendicular to the second direction Y. For example, the first direction X is the row direction, and the second direction Y is the column direction, but it is not limited to this case.

At least one embodiment of the present disclosure provides a display device, which includes any one of the display panels described above.

For example, the display device further includes a photosensitive sensor, and the photosensitive sensor is located at one side of the display panel.

Figure 26A:
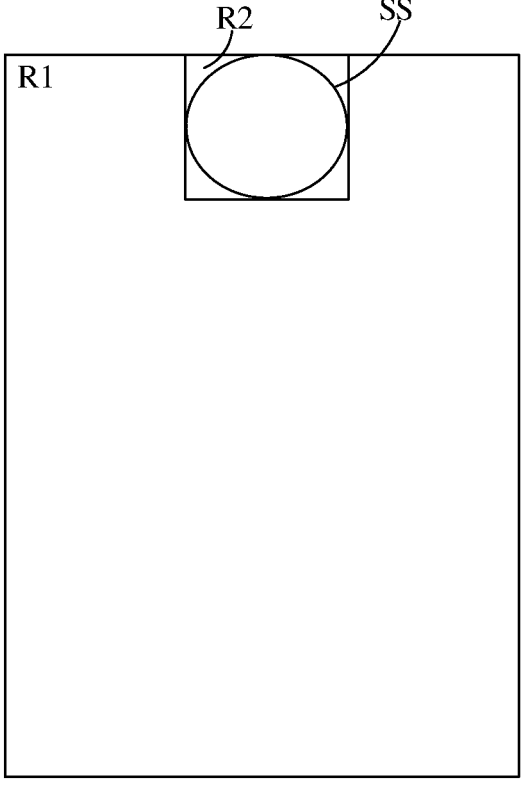
FIG. 26A and FIG. 26B are schematic diagrams of a display device provided by an embodiment of the present disclosure.
Figure 26B:
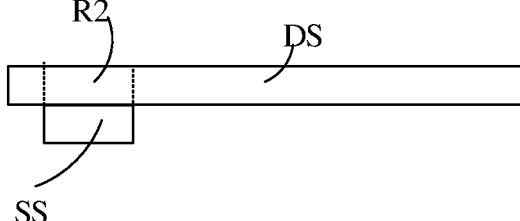

FIG. 26A and FIG. 26B are schematic diagrams of a display device provided by an embodiment of the present disclosure. As shown in FIG. 26A and FIG. 26B, the sensor SS is located at one side of the display panel DS and in the second display region R2. The ambient light can be perceived by the sensor SS after transmitted through the second display region R2. As shown in FIG. 26B, the side of the display panel where the sensor SS is not provided is a display side which can display images.

For example, the display device is a full display with camera (FDC) in the form of under-screen camera. For example, the display device includes an OLED or a product including OLED. For example, the display device includes any product or component which has a display function and includes the display panel described above, such as a TV, a digital camera, a mobile phone, a watch, a tablet computer, a laptop computer, a navigator, etc.

In the embodiments of the present disclosure, the elements located in the same layer can be formed by the same film layer through the same patterning process. For example, the elements located in the same layer can be located on the surface of a same element away from the base substrate.

It should be noted that, for clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and inkjet. The photolithography process refers to the process including film formation, exposure, development, etc., by using photoresist, mask, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display panel, comprising:
a base substrate, having a first display region and a second display region, wherein the first display region is located at at least one side of the second display region;
a plurality of first pixel circuits, located in the first display region;
a plurality of first light-emitting elements, located in the first display region, wherein each of the plurality of first pixel circuits is configured to drive at least one first light-emitting element of the plurality of first light-emitting elements;
a plurality of second pixel circuits, located in the first display region;
a plurality of second light-emitting elements, located in the second display region, wherein each of the plurality of second pixel circuits is configured to drive at least one second light-emitting element of the plurality of second light-emitting elements; and
a plurality of conductive lines, wherein the second pixel circuit is connected to the second light-emitting element through at least one conductive line,
wherein the plurality of second light-emitting elements comprise a plurality of groups, at least one group of the plurality of groups comprises a plurality of subgroups, each of the plurality of subgroups comprises at least one second light-emitting element, and in a same group, conductive lines connected to second light-emitting elements of different subgroups are located between second light-emitting elements of different adjacent groups,
wherein the plurality of groups are arranged in a first direction, and the plurality of subgroups are arranged in a second direction, the first direction is intersected with the second direction, and
a maximum distance between the conductive lines connected to second light-emitting elements of different subgroups in the same group in the first direction is greater than a size of one of the second light-emitting elements located between the conductive lines connected to second light-emitting elements of different subgroups in the same group in the first direction.

2. The display panel according to claim 1, wherein the first direction comprises a row direction, and the second direction comprises a column direction.

3. The display panel according to claim 1, wherein conductive lines connected to second light-emitting elements in a same subgroup are located in a same layer.

4. The display panel according to claim 1, wherein in a same group, conductive lines connected to second light-emitting elements in different subgroups are located in a same layer.

5. The display panel according to claim 2, wherein the plurality of conductive lines comprise at least two overlapped conductive lines, and overlapping portions of two conductive lines of the at least two overlapped conductive lines extend along the first direction.

6. The display panel according to claim 5, wherein at least two insulating layers are disposed between the at least two overlapped conductive lines.

7. The display panel according to claim 1, wherein in a same group, conductive lines connected to second light-emitting elements of a same subgroup are located between second light-emitting elements of same adjacent groups.

8. The display panel according to claim 1, wherein the plurality of subgroups comprise a first subgroup and a second subgroup, and a conductive line connected to a second light-emitting element in the first subgroup and a conductive line connected to a second light-emitting element in the second subgroup are separated by at least one group of second light-emitting elements.

9. The display panel according to claim 8, wherein the plurality of subgroups further comprise a third subgroup, the first subgroup, the second subgroup and the third subgroup are arranged in sequence, and the conductive line connected to the second light-emitting element in the second subgroup and a conductive line connected to a second light-emitting element in the third subgroup are separated by at least one group of second light-emitting elements.

10. The display panel according to claim 1, wherein the plurality of second pixel circuits are distributed, at intervals, among the plurality of first pixel circuits.

11. The display panel according to claim 1, wherein at least one first pixel circuit of the plurality of first pixel circuits is connected to at least one first light-emitting element of the plurality of first light-emitting elements, and an orthographic projection of the at least one first pixel circuit on the base substrate at least partially overlaps with an orthographic projection of the at least one first light-emitting element on the base substrate.

12. The display panel according to claim 11, wherein at least one second pixel circuit of the plurality of second pixel circuits is connected to at least one second light-emitting element of the plurality of second light-emitting elements through at least one conductive line.

13. The display panel according to claim 11, wherein orthographic projections of the plurality of second pixel circuits on the base substrate have no overlap with orthographic projections of the plurality of second light-emitting elements on the base substrate.

14. The display panel according to claim 1, wherein the first display region surrounds the second display region, and a shape of the second display region comprises a circle shape, and/or
wherein the second display region is axisymmetric.

15. The display panel according to claim 14, wherein the second display region comprises a first symmetry axis extending in a first direction and a second symmetry axis extending in a second direction.

16. The display panel according to claim 1, wherein the plurality of conductive lines comprise a plurality of first conductive lines located in a first pattern layer, a plurality of second conductive lines located in a second pattern layer and a plurality of third conductive lines located in a third pattern layer; the first pattern layer, the second pattern layer and the third pattern layer are arranged in sequence; and an orthographic projection of one first conductive line located in the first pattern layer on the base substrate partially overlaps with an orthographic projection of one third conductive line located in the third pattern layer on the base substrate.

17. The display panel according to claim 1, wherein the plurality of conductive lines comprise portions passing through a virtual dividing line between the first display region and the second display region, and portions, passing through the virtual dividing line between the first display region and the second display region, of conductive lines connected to second light-emitting elements of different subgroups, are located between second light-emitting elements of different adjacent groups.

18. A display device, comprising the display panel according to claim 1.

19. The display device according to claim 18, further comprising a photosensitive sensor, wherein the photosensitive sensor is located at one side of the display panel.

20. The display panel according to claim 1, wherein at least part of one of the conductive lines connected to second light-emitting elements of different subgroups in the same group is located in an interval between second light-emitting elements of adjacent groups.

\* \* \* \* \*